United States Patent
Koyama et al.

(10) Patent No.: US 9,647,152 B2
(45) Date of Patent: May 9, 2017

(54) SENSOR CIRCUIT AND SEMICONDUCTOR DEVICE INCLUDING SENSOR CIRCUIT

(71) Applicant: SEMICONDUCTOR ENERGY LABORATORY CO., LTD., Atsugi-shi, Kanagawa-ken (JP)

(72) Inventors: Jun Koyama, Kanagawa (JP); Tomokazu Yokoi, Kanagawa (JP); Tsutomu Murakawa, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 413 days.

(21) Appl. No.: 14/190,126

(22) Filed: Feb. 26, 2014

(65) Prior Publication Data

US 2014/0246667 A1    Sep. 4, 2014

(30) Foreign Application Priority Data

Mar. 1, 2013    (JP) ................. 2013-040501

(51) Int. Cl.
*H01L 31/02*    (2006.01)
*H01L 31/0296*    (2006.01)
(Continued)

(52) U.S. Cl.
CPC ........ *H01L 31/0296* (2013.01); *G01J 1/0219* (2013.01); *G01J 1/429* (2013.01); *G01J 1/44* (2013.01); *G01J 2001/4473* (2013.01)

(58) Field of Classification Search
CPC ......... H01L 31/0296; G01J 1/429; G01J 1/44; G01J 1/0219; G01J 2001/4473
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Selim Ahmed
(74) *Attorney, Agent, or Firm* — Nixon Peabody LLP; Jeffrey L. Costellia

(57) ABSTRACT

A sensor circuit includes a transistor comprising an oxide semiconductor; a first circuit which supplies one of a first potential and a second potential; a first switch; a second switch; and a second circuit to which a current flowing between a source and a drain of the transistor is applied via the second switch when the first potential is applied to a gate of the transistor. The first potential is lower than a potential of the source or a potential of the drain of the transistor, and the second potential is higher than the potential of the source or the potential of the drain of the transistor. The first switch electrically connects the source and the drain of the transistor when the second potential is applied to the gate of the transistor, and electrically isolates them when the first potential is applied to the gate of the transistor.

12 Claims, 18 Drawing Sheets

(51) Int. Cl.
*G01J 1/42* (2006.01)
*G01J 1/02* (2006.01)
*G01J 1/44* (2006.01)

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,372,664 | B2 | 2/2013 | Tsuji et al. |
| 8,426,853 | B2 | 4/2013 | Saito et al. |
| 8,659,941 | B2 | 2/2014 | Kamata et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0122673 | A1* | 5/2011 | Kamata ............... G11C 16/02 365/114 |
| 2011/0133182 | A1* | 6/2011 | Saito ............... H01L 27/1214 257/43 |
| 2013/0265098 | A1 | 10/2013 | Takahashi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-067331 A | 3/2007 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

(56) References Cited

OTHER PUBLICATIONS

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350°C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

OHara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:the "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure For Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H. "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

OHara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED,", IDW '06 Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kr stallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

SENSOR CIRCUIT AND SEMICONDUCTOR DEVICE INCLUDING SENSOR CIRCUIT

BACKGROUND OF THE INVENTION

1. Field of the Invention

The present invention relates to a semiconductor device. For example, the present invention relates to a sensor circuit and a semiconductor device including the sensor circuit.

2. Description of the Related Art

The doses of ultraviolet light reaching the earth's surface are increasing. As a countermeasure against ultraviolet light, there is a movement to install a sensor circuit that enables to measure the doses of ultraviolet light in a portable electronic device. Installing a sensor circuit that enables to measure the doses of ultraviolet light in a portable electronic device can satisfy users' needs of measuring the doses of ultraviolet light in desired places.

Patent Document 1 describes an ultraviolet light sensor using a silicon photodiode.

REFERENCE

Patent Document

[Patent Document 1] Japanese Published Patent Application No. 2007-067331

SUMMARY OF THE INVENTION

To install a sensor circuit that enables to measure the doses of ultraviolet light in a portable electronic device, the sensor circuit needs to be used under a wide range of environmental conditions. Such a sensor circuit usable under various environmental conditions can be installed in varied electronic devices (including a portable electronic device), i.e., the application range of the sensor circuit can be extended.

In Patent Document 1, a semiconductor having a band gap of approximately 1.1 eV, such as silicon, is used for a photodiode. For this reason, the amount of dark current is significantly increased with a rise in temperature, which narrows the temperature range where the ultraviolet light sensor can be used. The photodiode using silicon has another problem in that the photodiode is greatly degraded by continuous ultraviolet light irradiation and thus has low reliability.

In addition, the photodiode using silicon has relatively high sensitivity to visible light in many cases. To increase the sensitivity to ultraviolet light, the structure of the photodiode is devised; for example, a filter that selectively transmits ultraviolet light is provided; the thickness of a silicon film is adjusted; or the position of an impurity region is controlled. Unfortunately, each structure is a factor in increasing the manufacturing cost of the sensor circuit that enables to measure the doses of ultraviolet light.

In view of the above technical background, an object of one embodiment of the present invention is to provide a sensor circuit that can be used in a wide temperature range. Another object of one embodiment of the present invention is to provide a highly reliable sensor circuit. Another object of one embodiment of the present invention is to provide a sensor circuit having high sensitivity to ultraviolet light.

Another object of one embodiment of the present invention is to provide a semiconductor device that can be used in a wide temperature range. Another object of one embodiment of the present invention is to provide a highly reliable semiconductor device. Another object of one embodiment of the present invention is to provide a high-performance semiconductor device.

In one embodiment of the present invention, an oxide semiconductor having a higher band gap than silicon, specifically, an IGZO-based oxide semiconductor that contains In, Ga, and Zn, is used for detecting ultraviolet light. For example, the band gap of the IGZO-based oxide semiconductor is approximately 3.2 eV. This value is approximately three times the band gap of silicon, approximately 1.1 eV. In one embodiment of the present invention, a transistor including a channel formation region in an oxide semiconductor is used, and the amount of off-state current flowing through the transistor during ultraviolet light irradiation is measured, whereby the intensity of ultraviolet light can be obtained as data.

In a sensor circuit using an oxide semiconductor that has a larger band gap than silicon, the absorption edge of light can be on a shorter wavelength side than that in a sensor circuit using silicon. Specifically, in the case where an IGZO-based oxide semiconductor having a band gap of approximately 3.2 eV is used for a sensor circuit, the absorption edge of light is approximately four hundreds and several tens of nanometers; thus, the sensitivity to ultraviolet light can be increased. The use of an oxide semiconductor having a higher band gap than silicon can also suppress an increase in dark current caused by a rise in sensor circuit temperature, which widens the temperature range where the sensor circuit can be used.

When a transistor including a channel formation region in an oxide semiconductor is irradiated with light in a state where the potential of a gate is lower than that of a source or a drain, threshold voltage of the transistor tends to shift in the negative direction. In view of this, in one embodiment of the present invention, during the measurement of the intensity of ultraviolet light, a potential applied to the transistor is controlled such that the potential of the gate is higher than that of the source or the drain.

With the above structure, in one embodiment of the present invention, threshold voltage shift of the transistor including a channel formation region in an oxide semiconductor can be prevented; as a result, the reliability of the sensor circuit can be increased.

Specifically, a sensor circuit of one embodiment of the present invention includes a transistor including a channel formation region in an oxide semiconductor; a first circuit which supplies one of a first potential and a second potential to a gate of the transistor; and a second circuit to which a current flowing between a source and a drain of the transistor is applied when the first potential is applied to the gate of the transistor, whereby the second circuit generates a signal including data of a value of the current. The first potential is lower than a potential of the source or a potential of the drain of the transistor, and the second potential is higher than the potential of the source or the potential of the drain of the transistor.

Specifically, a sensor circuit of another embodiment of the present invention includes a transistor including a channel formation region in an oxide semiconductor; a first circuit which supplies one of a first potential and a second potential to a gate of the transistor; a first switch; a second switch; and a second circuit to which a current flowing between a source and a drain of the transistor is applied via the second switch when the first potential is applied to the gate of the transistor. The first potential is lower than a potential of the source or a potential of the drain of the transistor, and the second potential is higher than the potential of the source or the potential of the drain of the transistor. The first switch electrically connects the source and the drain of the transistor when the second potential is applied to the gate of the transistor, and electrically isolates them when the first potential is applied to the gate of the transistor. The second circuit has a function of generating a voltage corresponding to a value of the current.

With one embodiment of the present invention, a sensor circuit that can be used in a wide temperature range, a highly reliable sensor circuit, or a sensor circuit having high sensitivity to ultraviolet light can be provided. In addition, with one embodiment of the present invention, a semiconductor device that can be used in a wide temperature range, a highly reliable semiconductor device, or a high-performance semiconductor device can be provided.

DETAILED DESCRIPTION OF THE INVENTION

Embodiments of the present invention will be described below in detail with reference to the accompanying drawings. Note that the present invention is not limited to the following description, and it is easily understood by those skilled in the art that the mode and details can be variously changed without departing from the scope and spirit of the present invention. Accordingly, the present invention should not be construed as being limited to the description of the embodiments below.

Note that a sensor circuit of one embodiment of the present invention can be employed for a wide variety of semiconductor devices such as integrated circuits, RF tags, and semiconductor display devices. The semiconductor devices using a sensor circuit are included in the category of the present invention. The integrated circuits include, in its category, large scale integrated circuits (LSIs) including a microprocessor, an image processing circuit, a digital signal processor (DSP), and a microcontroller, and programmable logic devices (PLDs) such as a field programmable gate array (FPGA) and a complex PLD (CPLD). The semiconductor display devices include, in the category, liquid crystal display devices; light-emitting devices including pixels each provided with a light-emitting element typified by an organic light-emitting element; electronic paper; digital micromirror devices (DMDs); plasma display panels (PDPs); and field emission displays (FEDs).

⟨Configuration Example of Sensor Circuit⟩

Figure 1:
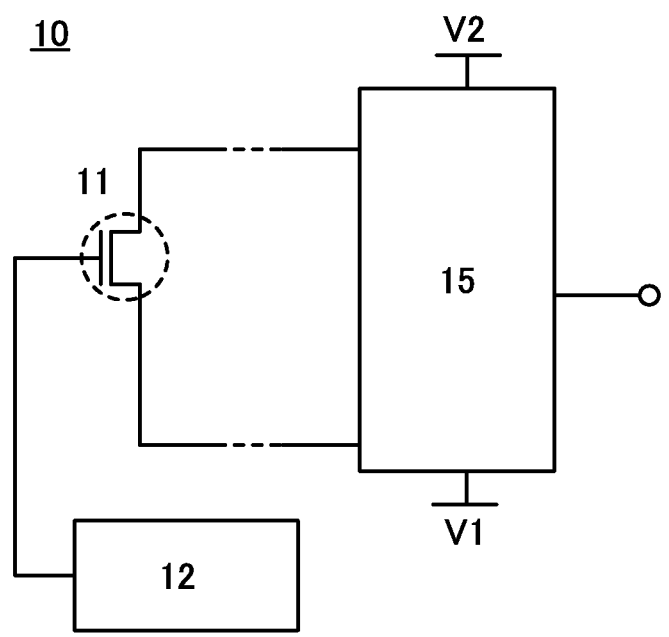
FIG. 1 illustrates an example of a configuration of a sensor circuit.

FIG. 1 illustrates a configuration example of a sensor circuit 10 of one embodiment of the present invention. The sensor circuit 10 illustrated in FIG. 1 includes a transistor 11, a circuit 12, and a circuit 15.

The transistor 11 has a function of a sensor, and includes a channel formation region in an oxide semiconductor having a larger band gap than silicon. Specifically, the band gap of an IGZO-based oxide semiconductor is approximately 3.2 eV. This value is approximately three times the band gap of silicon, approximately 1.1 eV. Therefore, in the transistor 11 including a channel formation region in an oxide semiconductor having a wide band gap, an increase in off-state current caused by a rise in temperature can be small comparing with a transistor including a channel formation region in silicon.

Note that off-state current in this specification refers to current flowing in a cut-off region between a source and a drain of a transistor, unless otherwise specified.

Since an oxide semiconductor has a larger band gap than silicon, an absorption edge of light in the oxide semiconductor is on a shorter wavelength side than an absorption edge of light in silicon. For example, an IGZO-based oxide semiconductor has a band gap of approximately 3.2 eV and the absorption edge of light in the IGZO-based oxide semiconductor is approximately four hundreds and several tens of nanometers. For this reason, comparing a transistor including a channel formation region in silicon, the transistor 11 including a channel formation region in an oxide semiconductor has high sensitivity to ultraviolet light (the wavelength region is approximately 1 nm to 400 nm) with respect to sensitivity to visible light (the wavelength region is higher than 400 nm).

FIG. 1 illustrates an example in which one transistor 11 is used as a sensor, but two or more transistors 11 connected in series or in parallel may be used as a sensor. Note that in this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

Note that "connection" in this specification means electrical connection and corresponds to the state in which current, voltage, or potential can be supplied or transmitted.

Accordingly, a connection state means not only a state of direct connection but also a state of electrical connection through a circuit element such as a wiring, a resistor, a diode, or a transistor so that current, voltage, or potential can be supplied or transmitted.

The circuit 12 has a function of controlling the potential of a gate of the transistor 11 by supplying a first potential or a second potential that is higher than the first potential to the gate of the transistor 11. When the first potential is applied, the potential of the gate of the transistor 11 is lower than the potential of a source of the transistor 11. Specifically, the first potential takes a value such that the transistor 11 operates in a cut-off region. When the second potential is applied, the potential of the gate of the transistor 11 is higher than the potential of the source of the transistor 11. Specifically, the second potential takes a value such that the transistor 11 operates in a weak-inversion region or a strong-inversion region.

Note that a "source" of a transistor means a source region that is part of a semiconductor film functioning as an active layer or a source electrode electrically connected to the semiconductor film. Similarly, a "drain" of a transistor means a drain region that is part of a semiconductor film functioning as an active layer or a drain electrode electrically connected to the semiconductor film. A "gate" means a gate electrode.

The terms "source" and "drain" of a transistor interchange with each other depending on the conductivity type of the transistor or levels of potentials applied to the terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

The circuit 15 has a function of generating a signal including data of the intensity of ultraviolet light emitted to the transistor 11 by using current (off-state current) flowing between the source and the drain of the transistor 11, when the first potential is applied to the gate of transistor 11.

The circuit 15 is supplied with a potential V1 that is low and a potential V2 that is high. A circuit group included in the circuit 15 is supplied with a potential difference between the potential V1 and the potential V2 as power supply voltage. The potential V1 is applied to one of the source and the drain of the transistor 11. Alternatively, a bias circuit may be provided between a wiring to which the potential V1 is applied and one of the source and the drain of the transistor 11.

When the transistor 11 is irradiated with light in a state where the potential of the gate of the transistor 11 is lower than that of the source or the drain of the transistor 11, threshold voltage of the transistor 11 tends to shift in the negative direction. However, the sensor circuit 10 illustrated in FIG. 1 can alternately bring the transistor 11 into a state where the potential of the gate is lower than that of the source or the drain and a state where the potential of the gate is higher than that of the source or the drain. Accordingly, in the sensor circuit 10 illustrated in FIG. 1, the transistor 11 does not remain in the state where the potential of the gate is lower than that of the source or the drain. Thus, threshold voltage of the transistor 11 can be prevented from being shifted in the negative direction, resulting in high reliability of the sensor circuit 10.

Figure 2:
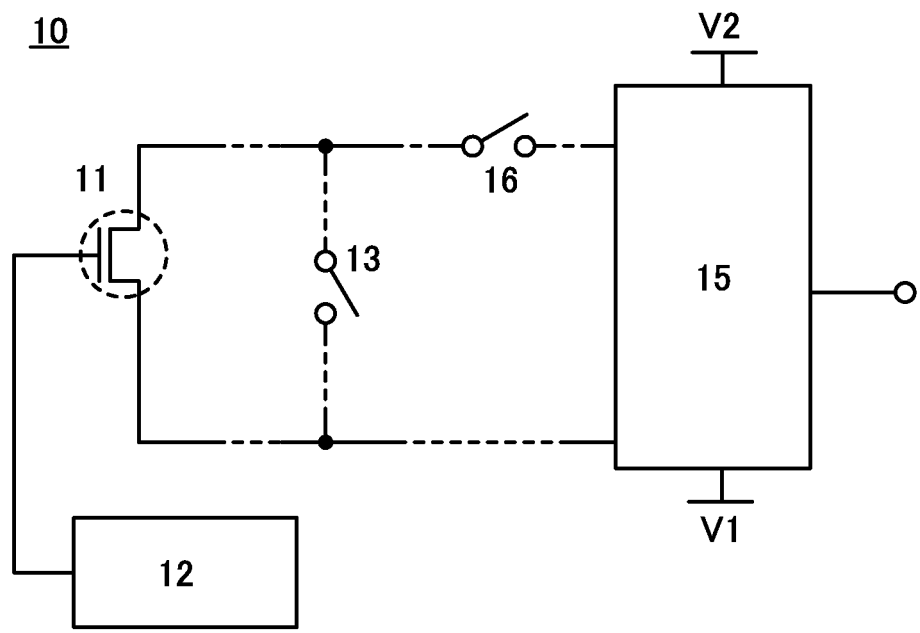
FIG. 2 illustrates an example of a configuration of a sensor circuit.

Next, FIG. 2 illustrates a specific configuration example of the sensor circuit 10 of one embodiment of the present invention illustrated in FIG. 1. The sensor circuit 10 illustrated in FIG. 2 further includes a switch 13 and a switch 16 in addition to the transistor 11, the circuit 12, and the circuit 15.

The switch 13 has a function of controlling electrical connection between the source and the drain of the transistor 11. When the switch 13 is on, substantially the same potentials are applied to the source and the drain of the transistor 11. When the switch 13 is off, the source and the drain of the transistor 11 are electrically isolated from each other.

The switch 16 has a function of controlling electrical connection between the transistor 11 and the circuit 15. When the switch 16 is on, current flowing between the source and the drain of the transistor 11 is supplied to the circuit 15. When the switch 16 is off, supply of current flowing between the source and the drain of the transistor 11 to the circuit 15 is stopped.

In a state where the potential of the gate of the transistor 11 is higher than that of the source or the drain of the transistor 11, even when the gate voltage is higher than the threshold voltage and the transistor 11 is on, a potential difference between the source and the drain of the transistor 11 is close to 0 because the switch 13 is on. Accordingly, even when the transistor 11 is on, current flowing between the source and the drain of the transistor 11 is close to 0. When the switch 16 is off, the transistor 11 and the circuit 15 are electrically isolated from each other. Accordingly, for example, by turning off the switch 16 before turning on the switch 13, supply of current flowing between the source and the drain of the transistor 11 to the circuit 15 can be stopped.

Figure 3:
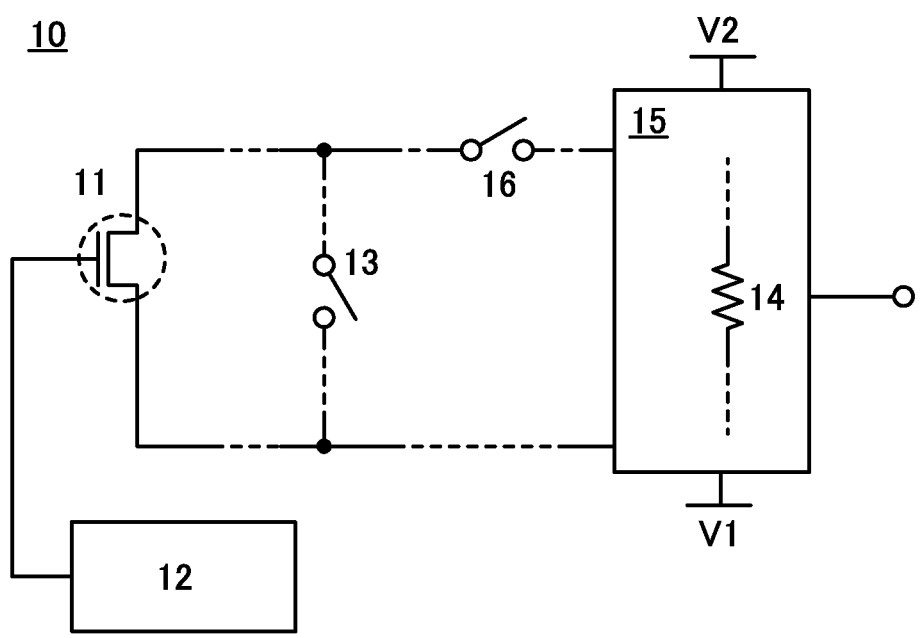
FIG. 3 illustrates an example of a configuration of a sensor circuit.

FIG. 3 illustrates a specific configuration example of the sensor circuit 10 of one embodiment of the present invention illustrated in FIG. 1. The sensor circuit 10 illustrated in FIG. 3 further includes the switch 13 and the switch 16 in addition to the transistor 11, the circuit 12, and the circuit 15. The circuit 15 further includes a resistor 14.

The circuit 15 has a function of generating a signal including data of the intensity of ultraviolet light emitted to the transistor 11 by using current flowing between the source and the drain of the transistor 11. Specifically, the resistor 14 included in the circuit 15 generates voltage that corresponds to off-state current of the transistor 11 during ultraviolet light irradiation.

The circuit 15 is supplied with the potential V1 that is low and the potential V2 that is high. Except for the resistor 14, a circuit group included in the circuit 15 is supplied with a potential difference between the potential V1 and the potential V2 as power supply voltage.

Next, operation of the sensor circuit 10 illustrated in FIG. 3 in the case where the transistor 11 is an n-channel transistor is described as an example.

Figure 4A:
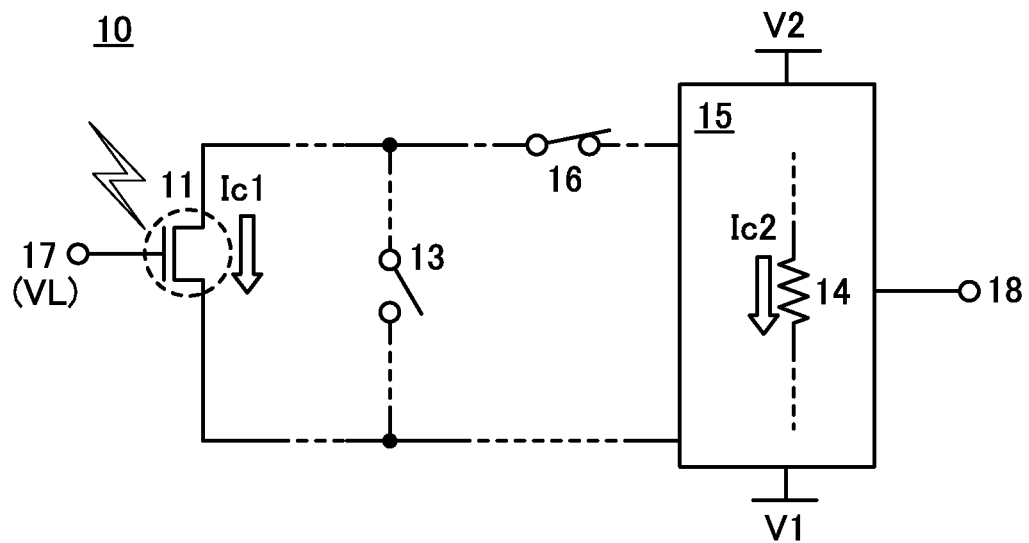
FIGS. 4A and 4B illustrate operation of a sensor circuit.

FIG. 4A schematically illustrates operation of the sensor circuit 10 in a period 1 in which the intensity of ultraviolet light is measured. Note that in the sensor circuit 10 in FIG. 4A, the circuit 12 is not illustrated and the gate of the transistor 11 is connected to a wiring 17.

In the period 1, the first potential (VL) is supplied from the circuit 12 to the gate of the transistor 11 via the wiring 17. In the period 1, the switch 13 is off and the switch 16 is on. In this state, when the transistor 11 is irradiated with ultraviolet light, an off-state current Ic1 flows between the source and the drain of the transistor 11. The value of off-state current Ic1 depends on the intensity of ultraviolet light. The off-state current Ic1 is supplied to the circuit 15 via the switch 16.

In the circuit 15, the supplied off-state current Ic1 or a current Ic2 having a value corresponding to the supplied off-state current is supplied to the resistor 14. FIG. 4A illustrates a case where the current Ic2 is supplied to the resistor 14. The resistor 14 generates voltage corresponding to the supplied current, in accordance with the resistance value of the resistor 14. The voltage generated by the resistor 14 reflects the intensity of ultraviolet light emitted to the transistor 11. The circuit 15 uses the voltage to output a signal including data of the intensity of ultraviolet light to a wiring 18.

Figure 4B:
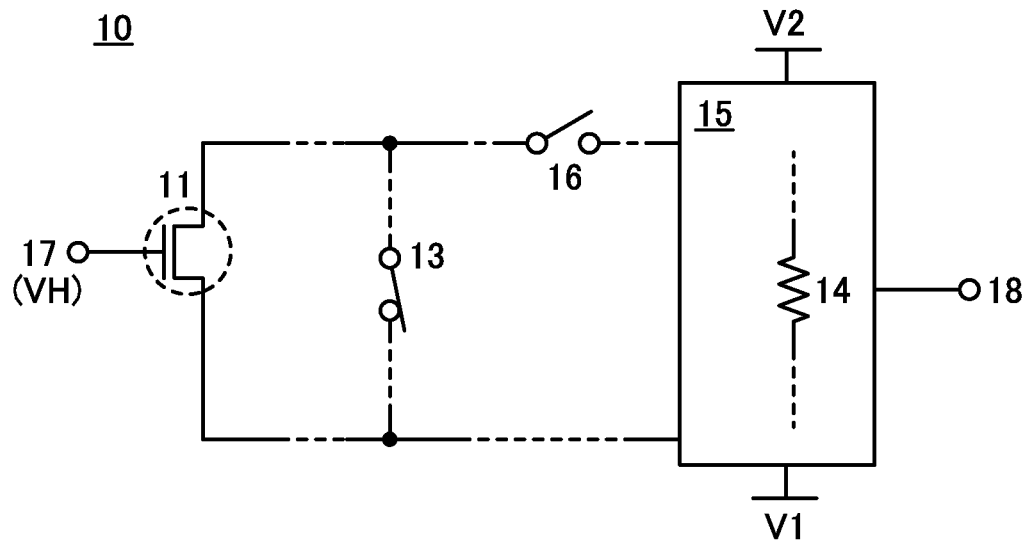

Next, FIG. 4B schematically illustrates operation of the sensor circuit 10 in a period 2 after the period 1. Note that in the sensor circuit 10 in FIG. 4B, the circuit 12 is not illustrated and the gate of the transistor 11 is connected to a wiring 17, as in a manner similar to FIG. 4A.

In the period 2, the second potential (VH) is supplied from the circuit 12 to the gate of the transistor 11 via the wiring 17. The gate voltage of the transistor 11 is higher than the threshold voltage; thus, the transistor 11 is turned on. In the period 2, the switch 13 is on and the switch 16 is off.

In the period 1, when the transistor 11 is irradiated with light in a state where the potential of the gate of the transistor 11 is lower than that of the source or the drain of the transistor 11, threshold voltage of the transistor 11 tends to shift in the negative direction. However, in the period 2, the second potential (VH) is supplied to the gate of the transistor 11, so that the potential of the gate is higher than that of the source or the drain of the transistor 11. Accordingly, by providing the period 2 after the period 1, the transistor 11 does not remain in the state where the potential of the gate is lower than that of the source or the drain. Thus, threshold voltage of the transistor 11 can be prevented from being shifted in the negative direction, resulting in high reliability of the sensor circuit 10.

In a state where the potential of the gate of the transistor 11 is higher than that of the source or the drain of the transistor 11, even when the gate voltage is higher than the threshold voltage and the transistor 11 is on, a potential difference between the source and the drain of the transistor 11 is close to 0 because the switch 13 is on. Accordingly, even when the transistor 11 is on, current flowing between the source and the drain of the transistor 11 is close to 0. When the switch 16 is off, the transistor 11 and the circuit 15 are electrically isolated from each other. Accordingly, for example, by turning off the switch 16 before turning on the switch 13, supply of current flowing between the source and the drain of the transistor 11 to the circuit 15 can be stopped.

⟨Specific Configuration Example 1 of Sensor Circuit⟩

Figure 5:
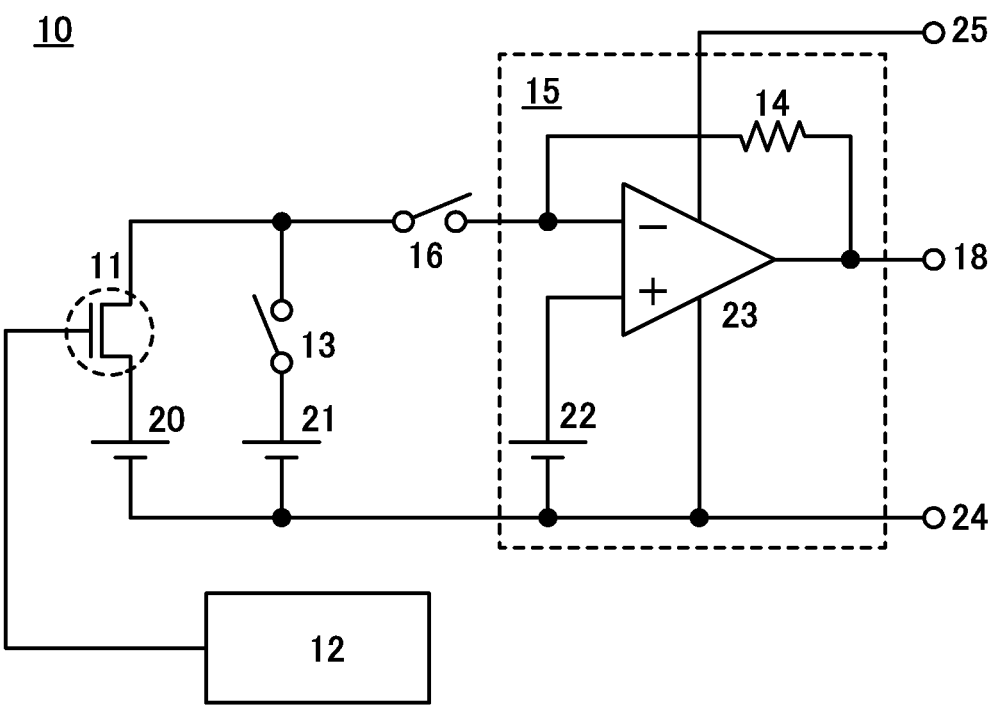
FIG. 5 illustrates an example of a configuration of a sensor circuit.

FIG. 5 illustrates an example of a specific configuration of the sensor circuit 10 illustrated in FIG. 1.

Like the sensor circuit 10 illustrated in FIG. 1, the sensor circuit 10 illustrated in FIG. 5 includes the transistor 11, the circuit 12, the switch 13, the circuit 15 including the resistor 14, and the switch 16. The sensor circuit 10 illustrated in FIG. 5 further includes a bias supply 22 and an amplifier 23, which are included in the circuit 15, a bias supply 20, and a bias supply 21.

The bias supply 20 has a function of supplying a potential in which bias voltage is added to a potential (the potential V1) of a wiring 24 to one of the source and the drain of the transistor 11. The bias supply 21 has a function of supplying the potential in which bias voltage is added to a potential (the potential V1) of the wiring 24 to the other of the source and the drain of the transistor 11 via the switch 13. The bias supply 22 has a function of supplying the potential in which bias voltage is added to a potential (the potential V1) of the wiring 24 to a non-inverting input terminal (+) of the amplifier 23. An inverting input terminal (−) of the amplifier 23 is connected to the other of the source and the drain of the transistor 11 via the switch 16. A first terminal of the resistor 14 is connected to the inverting input terminal (−) of the amplifier 23, and a second terminal of the resistor 14 is connected to an output terminal of the amplifier 23. The output terminal of the amplifier 23 is connected to the wiring 18. The wiring 24 is connected to a first power supply terminal of the amplifier 23. The wiring 25 to which the potential V2 is applied is connected to a second power supply terminal of the amplifier 23.

In the period 1, when off-state current of the transistor 11 is supplied to the circuit 15, the off-state current flows through the resistor 14 in the sensor circuit 10 illustrated in FIG. 5. Because the amplifier 23 and the resistor 14 form an inverting amplifier circuit, voltage which is the sum of a resistance value of the resistor 14 and the off-state current is applied to the output terminal of the amplifier 23. Thus, even when the amount of off-state current is hardly changed by ultraviolet light irradiation, the voltage applied to the output terminal of the amplifier 23 can be amplified by adjusting the resistance value of the resistor 14.

When an inverting amplifier circuit including the amplifier 23 is used as the circuit 15, change in electrical characteristics depending on the temperature (i.e., the temperature dependence) can be small in the circuit 15. As a result, with the use of the inverting amplifier circuit including the amplifier 23 as the circuit 15, voltage applied to the wiring 18 can be prevented from being changed by a temperature change.

Although the circuit 15 illustrated in FIG. 5 is an inverting amplifier circuit including the amplifier 23, the circuit 15 may be a non-inverting amplifier circuit including the amplifier 23. In the case where a non-inverting amplifier circuit including the amplifier 23 is used as the circuit 15, the circuit is configured such that off-state current of the transistor 11 is supplied to the inverting input terminal (+) of the amplifier 23.

⟨Specific Configuration Example 2 of Sensor Circuit⟩

Figure 6:
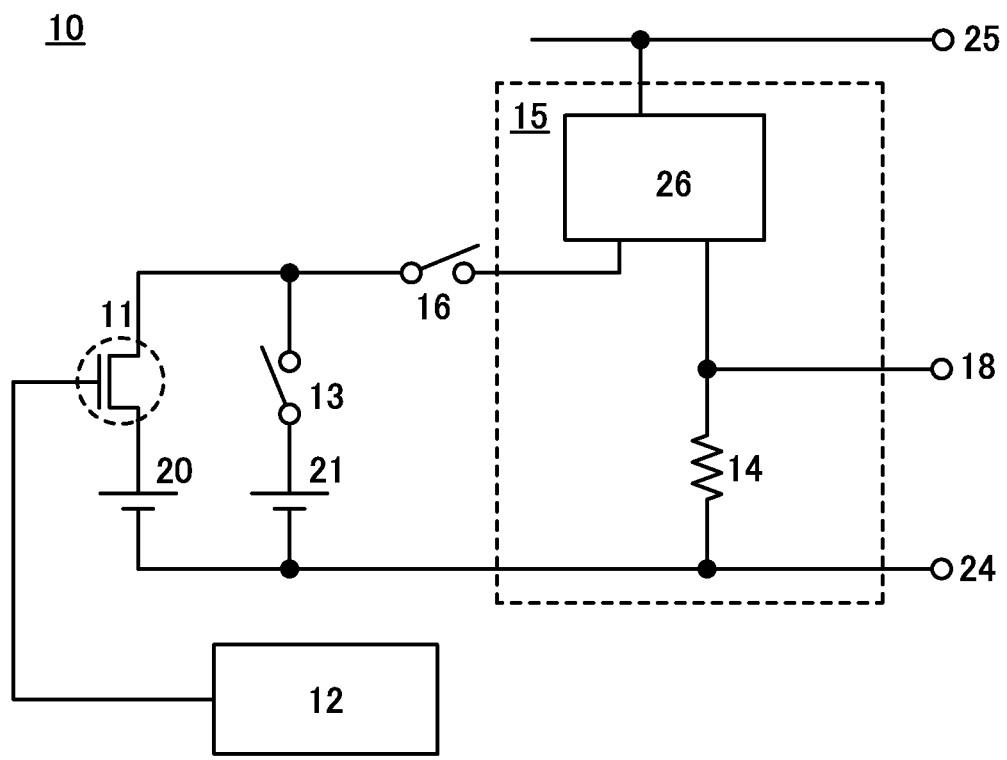
FIG. 6 illustrates an example of a configuration of a sensor circuit.

FIG. 6 illustrates another example of a specific configuration of the sensor circuit 10 illustrated in FIG. 1.

Like the sensor circuit 10 illustrated in FIG. 1, the sensor circuit 10 illustrated in FIG. 6 includes the transistor 11, the circuit 12, the switch 13, the circuit 15 including the resistor 14, and the switch 16. The sensor circuit 10 illustrated in FIG. 6 further includes the bias supply 20, the bias supply 21, and a current mirror circuit 26 that is included in the circuit 15.

The bias supply 20 has a function of supplying a potential in which bias voltage is added to a potential (the potential V1) of the wiring 24 to one of the source and the drain of the transistor 11. The bias supply 21 has a function of supplying a potential in which bias voltage is added to a potential (the potential V1) of the wiring 24 to the other of the source and the drain of the transistor 11 via the switch 13. A first terminal of the current mirror circuit 26 is connected to the other of the source and the drain of the transistor 11 via the switch 16. The first terminal of the resistor 14 is connected to a second terminal of the current mirror circuit 26 and the wiring 18. The second terminal of the resistor 14 is connected to the wiring 24. A third terminal of the current mirror circuit 26 is connected to the wiring 25.

In the period 1, when off-state current of the transistor 11 is supplied to the circuit 15, the off-state current flows between the first terminal and the third terminal of the current mirror circuit 26 in the sensor circuit 10 illustrated in FIG. 6. The current mirror circuit 26 has a function of making current (that is proportional to the off-state current flowing between the first terminal and the third terminal) flow between the third terminal and the second terminal. Thus, the current that is proportional to the off-state current is supplied to the resistor 14 via the first terminal and the third terminal of the current mirror circuit 26. Then, voltage corresponding to the supplied current, i.e., voltage corresponding to the off-state current, is generated by the resistor 14.

⟨Configuration Example of Current Mirror Circuit⟩

Next, an example of a specific configuration of the current mirror circuit 26 is described.

Figure 7A:
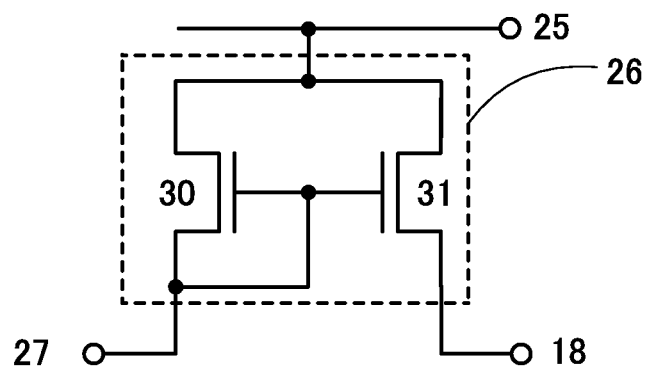
FIGS. 7A and 7B each illustrate an example of a configuration of a current mirror circuit.

FIG. 7A illustrates an example of a specific configuration of the current mirror circuit 26. The current mirror circuit 26 illustrated in FIG. 7A includes p-channel transistors 30 and 31. A drain of the transistor 30 is connected to a first terminal 27. A source of the transistor 30 is connected to the wiring 25 via the third terminal. The drain of the transistor 30 is connected to a gate of the transistor 30 and a gate of the transistor 31. A source of the transistor 31 is connected to the wiring 25 via the third terminal. A drain of the transistor 31 is connected to the wiring 18 and the first terminal of the resistor 14 (not shown) via the second terminal.

The transistor 30 operates in a saturation region, and when off-state current of the transistor 11 flows between the first terminal 27 and the wiring 25 that is connected to the third terminal, gate voltage corresponding to the off-state current is generated between the gate and the source of the transistor 30. The gate voltage generated between the gate and the source of the transistor 30 is applied between the gate and the source of the transistor 31. A current corresponding to the gate voltage is generated between the source and the drain of the transistor 31, and the current flows between the wiring 25 that is connected to the third terminal and the wiring 18 that is connected to the second terminal. The current flowing between the wiring 25 and the wiring 18 is supplied to the resistor 14.

Figure 7B:
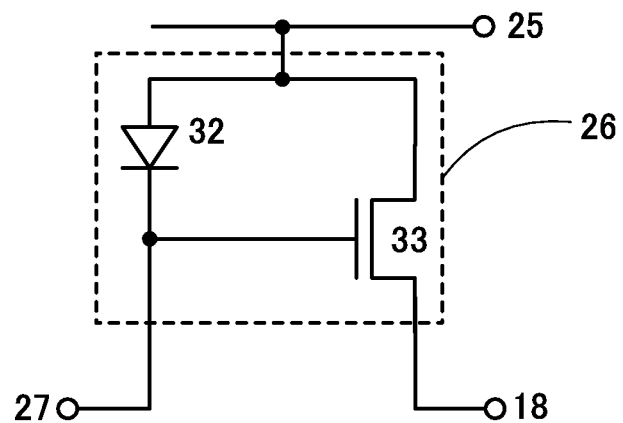

FIG. 7B illustrates another example of a specific configuration of the current mirror circuit 26. The current mirror circuit 26 illustrated in FIG. 7B includes a diode 32 and a p-channel transistor 33. A cathode of the diode 32 is connected to the first terminal 27. An anode of the diode 32 is connected to the wiring 25 via the third terminal. The cathode of the diode 32 is connected to a gate of the transistor 33. A source of the transistor 33 is connected to the wiring 25 via the third terminal. A drain of the transistor 33 is connected to the wiring 18 and the first terminal of the resistor 14 (not shown) via the second terminal.

When off-state current of the transistor 11 flows between the first terminal 27 and the wiring 25 that is connected to the third terminal, voltage corresponding to the off-state current is generated between the anode and the cathode of the diode 32. The voltage generated between the anode and the cathode of the diode 32 is applied between the gate and the source of the transistor 33. A current corresponding to the gate voltage is generated between the source and the drain of the transistor 33, and the current flows between the wiring 25 that is connected to the third terminal and the wiring 18 that is connected to the second terminal. The current flowing between the wiring 25 and the wiring 18 is supplied to the resistor 14.

⟨Configuration Example of Semiconductor Device⟩

Figure 8:
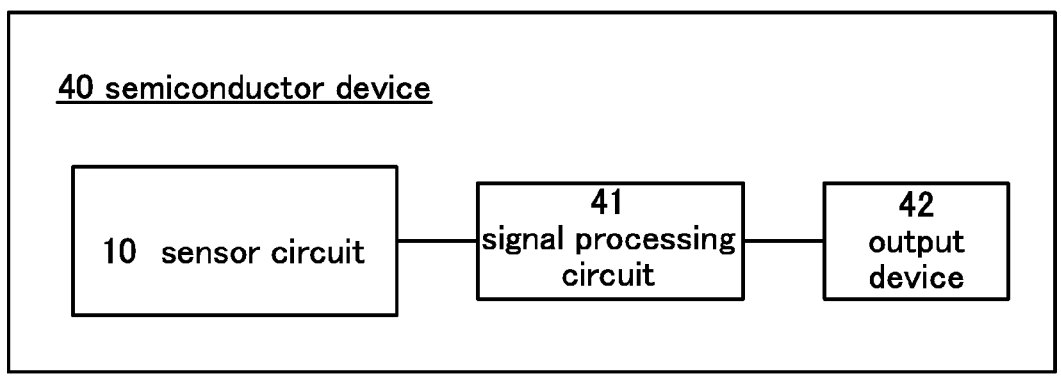
FIG. 8 illustrates an example of a structure of a semiconductor device.

FIG. 8 is a block diagram illustrating an example of a configuration of a semiconductor device 40 of one embodiment of the present invention. The semiconductor device 40 illustrated in FIG. 8 includes the sensor circuit 10, a signal processing circuit 41, and an output device 42.

A signal output from the sensor circuit 10 is supplied to the signal processing circuit 41. By using the signal, the signal processing circuit 41 generates a signal for controlling the operation of the output device 42. Specifically, the signal for controlling the operation of the output device 42 is, for example, a signal for making the output device 42 output data of the intensity of ultraviolet light included in the signal output from the sensor circuit 10; or a signal for changing operation of the output device 42 in accordance with data of the intensity of ultraviolet light included in the signal output from the sensor circuit 10.

Specific examples of the output device 42 include a display device, a lighting device, a printer, a plotter, and an audio output device. For example, in the case of using a display device as the output device 42, data of the intensity of ultraviolet light can be displayed on the display device. In the case of using a lighting device such as a mercury lamp as the output device 42, when the intensity of ultraviolet light emitted by the lighting device changes, the intensity of ultraviolet light emitted by the lighting device decreases can be adjusted by using data of the intensity of ultraviolet light obtained from the sensor circuit 10.

Figure 9:
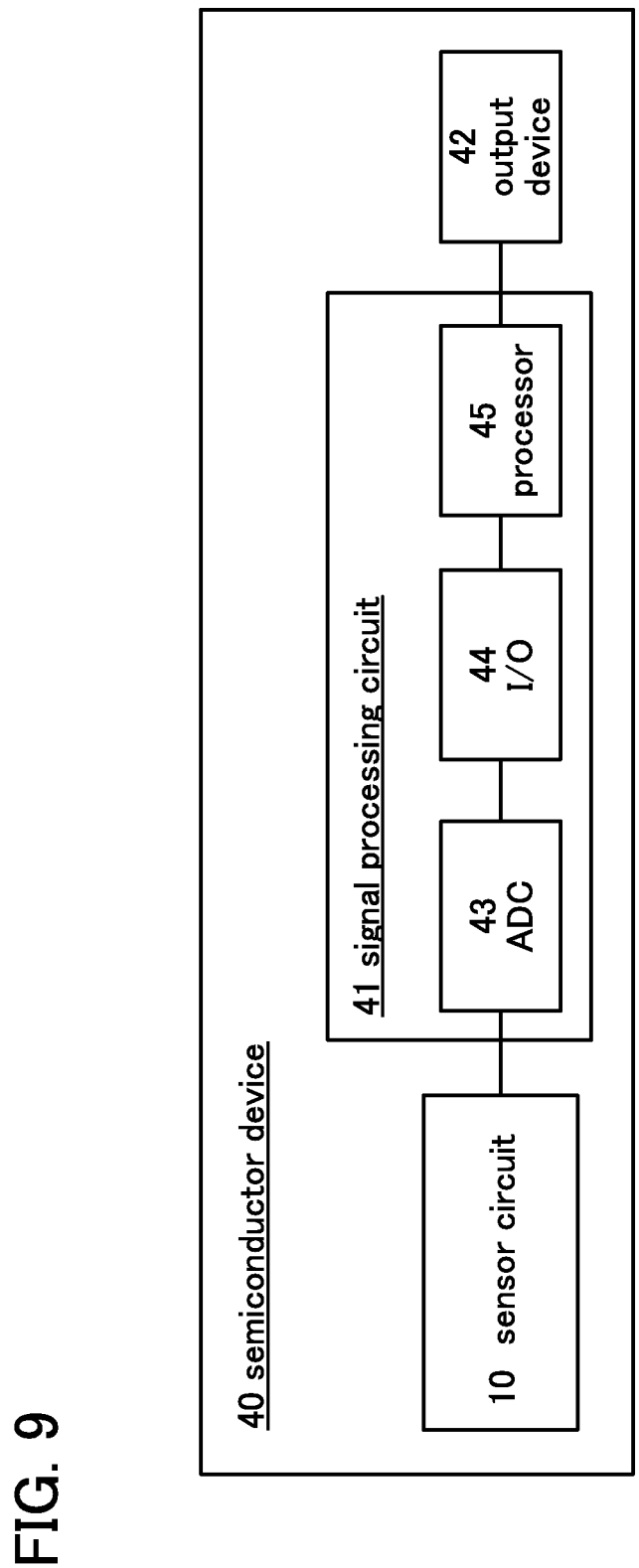
FIG. 9 illustrates an example of a structure of a semiconductor device.

Next, FIG. 9 illustrates an example of a specific configuration of the semiconductor device 40 illustrated in FIG. 8.

Like the semiconductor device 40 illustrated in FIG. 8, the semiconductor device 40 illustrated in FIG. 9 includes the sensor circuit 10, the signal processing circuit 41, and the output device 42. In the semiconductor device 40 illustrated in FIG. 9, the signal processing circuit 41 includes an analog-to-digital conversion circuit (ADC) 43, an I/O interface 44, and a processor 45.

The intensity of ultraviolet light emitted to the sensor circuit 10 continuously changes with time. The value of voltage Vout that is a signal output from the sensor circuit 10 is changed in accordance with the intensity of ultraviolet light. The ADC 43 has a function of obtaining and holding the voltage Vout in a predetermined period, that is, a function of performing sampling. In addition, the ADC 43 has a function of converting a value of the sampled voltage Vout from an analog value to a digital value.

The I/O interface 44 has a function of controlling input of a signal including the voltage Vout that is analog-to-digital converted by the ADC 43, from the ADC 43 to the processor 45.

The processor 45 has a function of generating a signal including data of the intensity of ultraviolet light in accordance with the specifications of the output device 42. The processor 45 generates the signal by arithmetic processing using the signal output from the ADC 43 via the I/O interface 44.

The signal including data of the intensity of ultraviolet light can be generated by associating the value of the voltage Vout, which is analog-to-digital converted by the ADC 43, with data of the intensity of ultraviolet light.

The signal processing circuit 41 may further include a circuit which performs signal processing on the voltage Vout. Examples of the circuit are a filter circuit and a linearization circuit. The filter circuit has a function of removing noise from the voltage Vout. The linearization circuit has a function of correcting the voltage Vout so that the value of the voltage Vout and the intensity of ultraviolet light have a linear relationship.

(Off-state Current of Transistor)

Next, described are results by measuring the off-state current of a transistor including a channel formation region in an oxide semiconductor film when the transistor is irradiated with light.

First, described is a structure of a transistor used for the measurement. The transistor includes, on an insulating surface, a gate electrode and a gate insulating film over the gate electrode. A 100-nm-thick tungsten film was used for the gate electrode. A 50-nm-thick silicon nitride film and a 200-nm-thick silicon oxynitride film were stacked as the gate insulating film in this order over the gate electrode. The transistor further includes a 35-nm-thick IGZO-based oxide semiconductor film which overlaps with the gate electrode with the gate insulating film provided therebetween. The IGZO-based oxide semiconductor film was formed by sputtering using a target with a composition of In:Ga:Zn=1:1:1. The transistor includes, over the oxide semiconductor film, a source electrode and a drain electrode formed by stacking a 50-nm-thick tungsten film, a 400-nm-thick aluminum film, and a 100-nm-thick titanium film in this order. Over the oxide semiconductor film, the source electrode, and the drain electrode, a 400-nm-thick silicon oxynitride film was provided.

In the transistor used for the measurement, the channel length L was 3 μm; the channel width W was 50 μm; and the length in the channel length L direction in a region where the source electrode and the drain electrode overlap with the gate electrode was 2 μm. The measurement was performed at room temperature under a dry atmosphere in a state where the transistor was irradiated with light using a 300 W xenon light source (MAX-302 manufactured by Asahi Spectra Co., Ltd) and the wavelength of the light was controlled with a band-pass filter. The irradiance per unit wavelength was measured with a spectroradiometer (USR-45 manufactured by USHIO INC.). The light irradiation was performed on the transistor such that the irradiance was kept constant.

Figure 10:
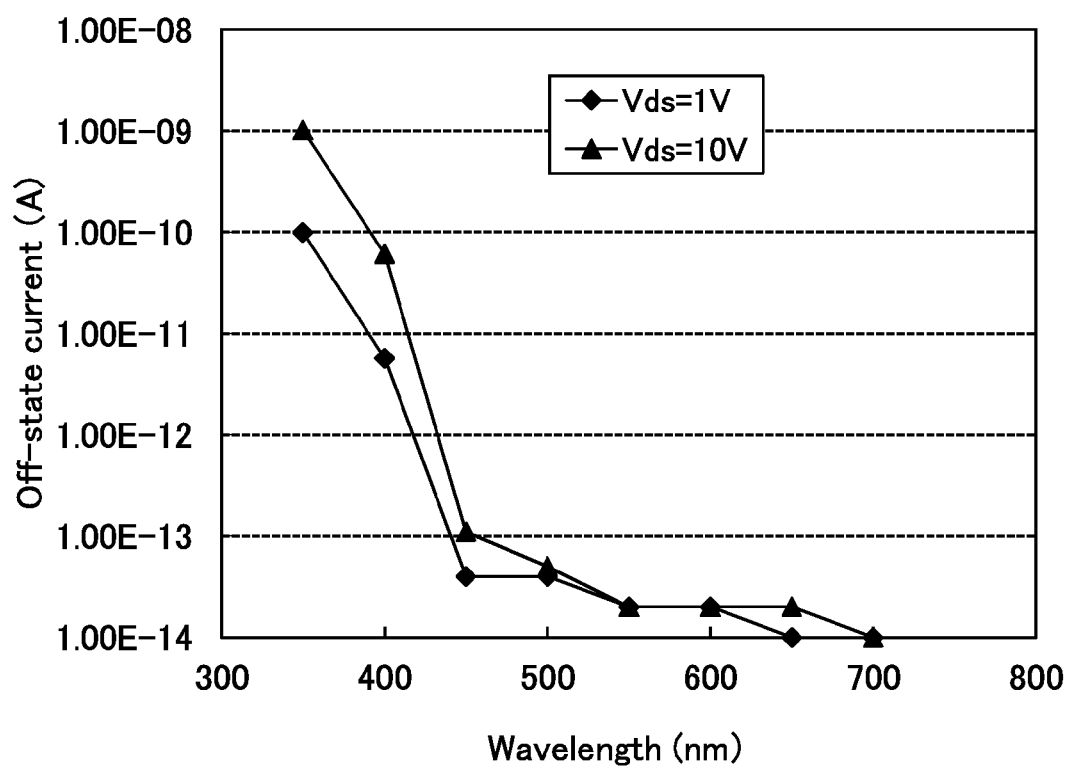
FIG. 10 is a graph showing the relation between a wavelength of light and off-state current of a transistor.

FIG. 10 shows the relation between light wavelength and off-state current of the transistor, which were obtained by the measurement. The measurement was performed in two cases: a case where the gate voltage was −10 V and the voltage Vds (a potential difference between the potential of a drain and the potential of a source when the potential of the source is used as a reference potential) was 1 V; and a case where the gate voltage was −10 V and the voltage Vds was 10 V. As can be seen from FIG. 10, when visible light having a wavelength of 450 nm or larger was emitted, off-state current of the transistor was lower than a lower measurement limit of $1\times10^{-13}$ A in both cases where the voltage Vds was 1 V and where the voltage Vds was 10 V. On the other hand, when ultraviolet light having a wavelength of 400 nm or shorter was emitted, off-state current of the transistor was $10^2$ to $10^4$ times as high as the lower measurement limit of $1\times10^{-13}$ A in both cases where the voltage Vds was 1 V and where the voltage Vds was 10 V. Therefore, a transistor including an IGZO-based oxide semiconductor has significantly higher sensitivity to ultraviolet light than sensitivity to visible light.

Next, described are the results by analyzing the relation between irradiance of ultraviolet light and off-state current.

The structure of a transistor used for the measurement was the same as the transistor used for the measurement shown in FIG. 10. The channel length L was 3 μm; the channel width W was $10^4$ μm; and the length in the channel length L direction in a region where the source electrode and the drain electrode overlap with the gate electrode was 2 μm. In a manner similar to the case of FIG. 10, the measurement was performed at room temperature under a dry atmosphere in a state where the transistor was irradiated with light using a 300 W xenon light source (MAX-302 manufactured by Asahi Spectra Co., Ltd) and the wavelength of the light was controlled to be 350 nm with a band-pass filter. The irradiance of light on the transistor was controlled by measuring irradiance per unit wavelength with a spectroradiometer (USR-45 manufactured by USHIO INC.).

Figure 11:
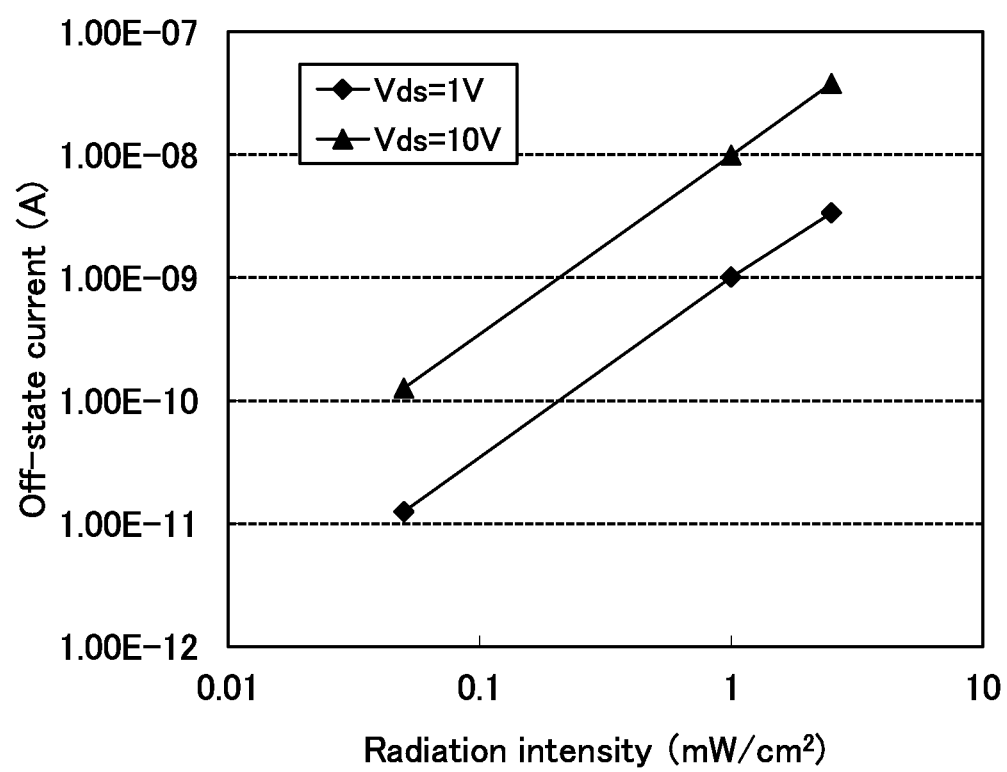
FIG. 11 is a graph showing the relation between irradiance and off-state current of a transistor.

FIG. 11 shows the relation between irradiance (unit: $mW/cm^2$) and off-state current (unit: A) of the transistor, which were obtained by the measurement. The measurement was performed in two cases: a case where the gate voltage was −10 V and the voltage Vds (a potential difference between the potential of a drain and the potential of a source when the potential of the source is used as a reference potential) was 1 V; and a case where the gate voltage was −10 V and the voltage Vds of a drain to a source was 10 V. As can be seen from FIG. 11, off-state current of the transistor increases as the irradiance increases in both cases where the voltage Vds was 1 V and where the voltage Vds was 10 V; and a logarithm of the irradiance was substantially proportional to a logarithm of the off-state current of the transistor.

Next, described are results by examining differences in electrical characteristics of transistors caused by the presence or absence of irradiation with light having a wavelength of 350 nm.

First, the structure of a transistor used for the measurement is described. For the measurement, three transistors (a first transistor, a second transistor, and a third transistor) having the same structure were used. A silicon substrate was covered with a 100-nm-thick thermal oxidation film, and a 100-nm-thick silicon oxide film was formed thereover by sputtering. Each transistor was formed over the 100-nm-thick silicon oxide film. Each transistor includes a gate electrode formed of a 150-nm-thick tungsten film; a gate insulating film formed of a 20-nm-thick silicon oxynitride film over the gate electrode; and a 15-nm-thick IGZO-based oxide semiconductor film which overlaps with the gate electrode with the gate insulating film provided therebetween. The IGZO-based oxide semiconductor film was formed by sputtering using a target with a composition of In:Ga:Zn=1:1:1. The transistor includes, over the oxide semiconductor film, a source electrode and a drain electrode formed of a 100-nm-thick tungsten film. Over the oxide semiconductor film, the source electrode, and the drain electrode, a 400-nm-thick silicon oxide film was provided. Over the silicon oxide film, a 1.5-μm-thick polyimide film was provided.

Each of the transistors used for the measurement had a channel length L of 3 μm and a channel width W of 10 μm. For evaluating electrical characteristics, measurement of drain current in a dark state (Measurement 1), measurement of drain current in a state where ultraviolet light is emitted (Measurement 2), application of voltage in a state where ultraviolet light is emitted (a stress application step), measurement of drain current in a state where ultraviolet light is emitted (Measurement 3), and measurement of drain current in a dark state (Measurement 4) were performed in this order.

Specifically, measurements of drain current in a dark state (Measurements 1 and 4) were performed at a substrate temperature of 40° C. under a dry atmosphere in a dark room without light irradiation. For the measurements, the gate voltage Vg was changed by 0.1 V in the range of −5 V to 5 V, and the voltage Vds was 0.1 V or 3 V.

The measurements of drain current in a state where ultraviolet light is emitted (Measurements 2 and 3) were performed at a substrate temperature of 40° C. under a dry atmosphere in a state where the transistor was irradiated with light having a wavelength of 350 nm at an irradiance of 2.5 mW/cm$^2$. For the measurements, the gate voltage Vg was changed by 0.1 V in the range of −5 V to 5 V, and the voltage Vds was set at 0.1 V or 3 V.

In the stress application step, a state in which the transistor was irradiated with light having a wavelength of 350 nm at an irradiance of 2.5 mW/cm$^2$ at a substrate temperature of 125° C. under a dry atmosphere was kept for one hour. In the first transistor among the three transistors, the gate voltage Vg and the voltage Vds were kept at −5 V and 5 V, respectively, through the stress application step. In the second transistor, a first state (the gate voltage Vg: −5 V, the voltage Vds: 5 V) and a second state (the gate voltage Vg: 5 V, the voltage Vds: 0 V) were alternately performed in the stress application step. The first state was kept for 0.1 second and the second state was kept for 0.9 second. In the third transistor, the gate voltage Vg and the voltage Vds were kept at 5 V and 0 V, respectively, through the stress application step.

Each transistor was irradiated with ultraviolet light using a 300 W xenon light source (MAX-302 manufactured by Asahi Spectra Co., Ltd) and the wavelength of the light was controlled with a band-pass filter. The irradiance of light having a wavelength of 350 nm was measured with a spectroradiometer (USR-45 manufactured by USHIO INC.). The light irradiation was performed on the transistor such that the irradiance was kept at approximately 2.5 mW/cm$^2$.

Figure 12A:
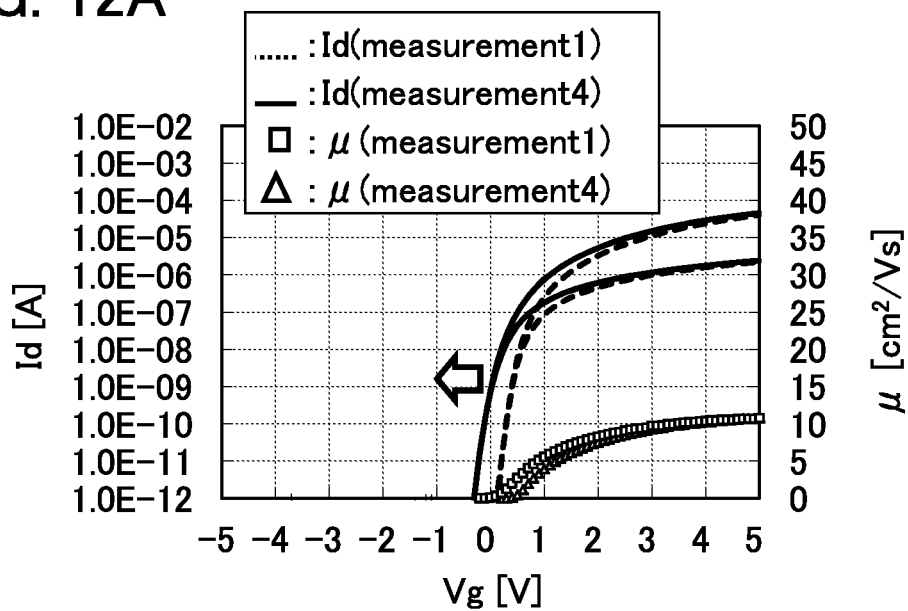
FIGS. 12A and 12B are graphs showing the relation between a gate voltage Vg and a drain current Id of a transistor, which are obtained by measurement.
Figure 12B:
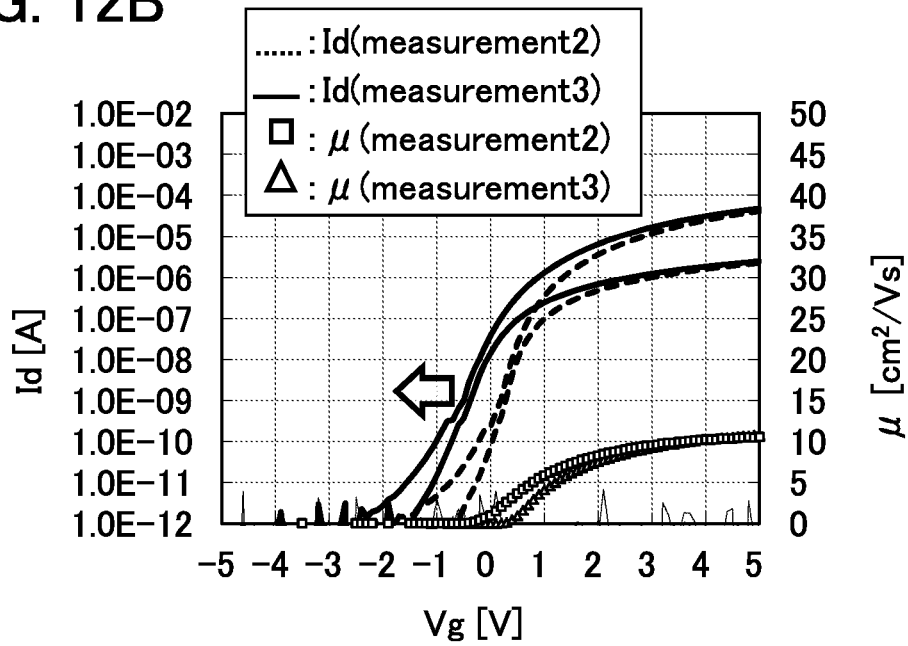

FIG. 12A shows the relation between the gate voltage Vg and the drain current Id in the first transistor, which were obtained by Measurement 1 and Measurement 4. FIG. 12A also shows the mobility μ obtained by calculation. FIG. 12B shows the relation between the gate voltage Vg and the drain current Id in the first transistor, which were obtained by Measurement 2 and Measurement 3. From FIG. 12A, it is found that through the stress application step, the threshold voltage and the shift value are shifted by −0.33 V and −0.42 V, respectively. From FIG. 12B, it is found that through the stress application step, the threshold voltage and the shift value are shifted by −0.45 V and −0.82 V, respectively.

Note that the threshold voltage and the mobility of each transistor are calculated on the assumption that relative dielectric constant is 4.1 and that the thickness of the gate insulating film is 20 nm. The shift value is defined as the value of gate voltage at the time when drain current rises. Specifically, in a graph showing the relation between gate voltage and drain current, the shift value can be defined as voltage at an intersection of a tangent where slope change in drain current is the steepest and a graduation line corresponding to the lowest drain current. The shift value is a value at the time when drain voltage Vds is 3 V.

Figure 13A:
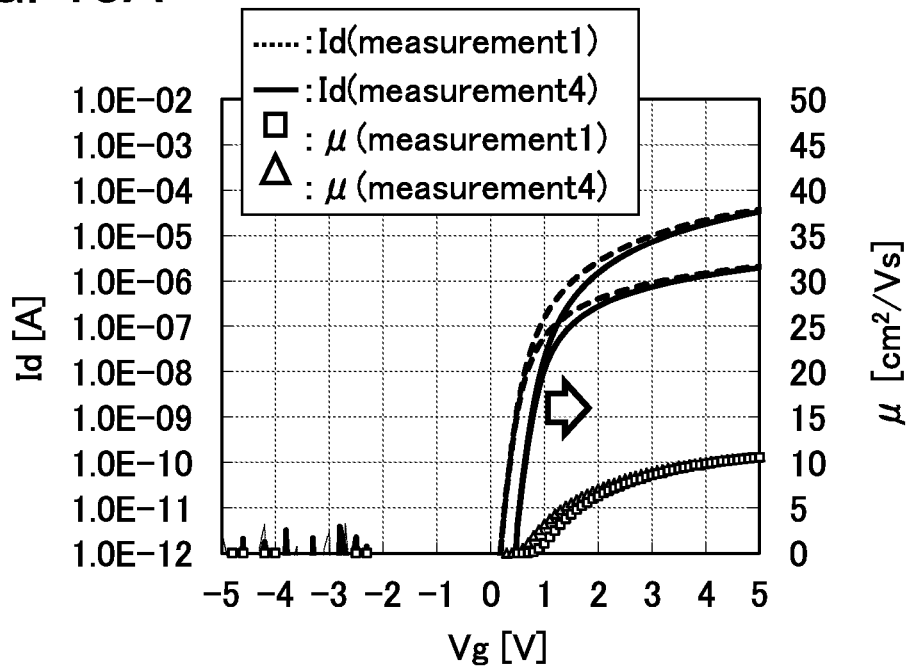
FIGS. 13A and 13B are graphs showing the relation between a gate voltage Vg and a drain current Id of a transistor, which are obtained by measurement.
Figure 13B:
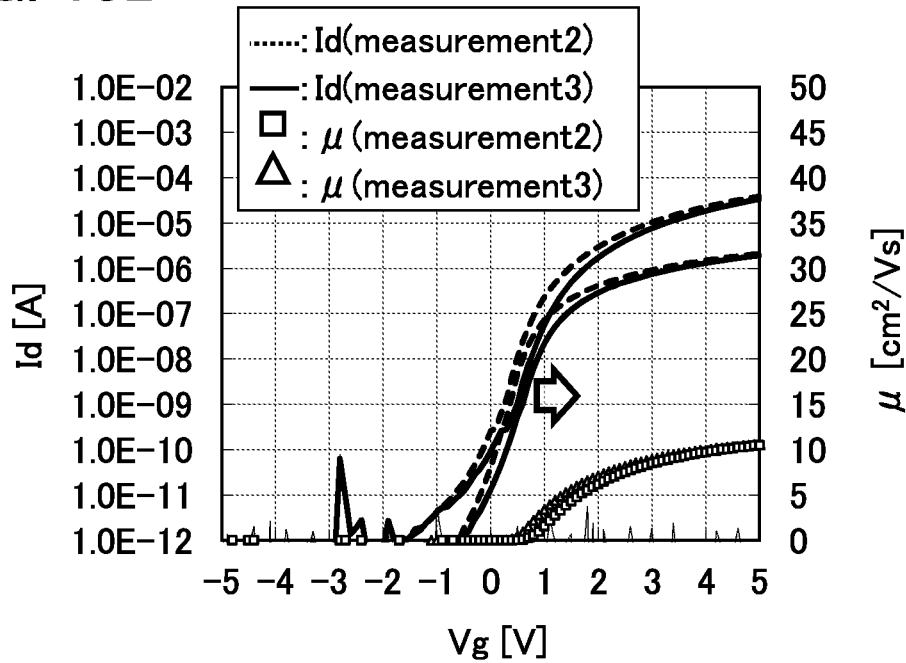

FIG. 13A shows the relation between the gate voltage Vg and the drain current Id in the second transistor, which were obtained by Measurement 1 and Measurement 4. FIG. 13A also shows the mobility μ obtained by calculation. FIG. 13B shows the relation between the gate voltage Vg and the drain current Id in the second transistor, which were obtained by Measurement 2 and Measurement 3. From FIG. 13A, it is found that through the stress application step, the threshold voltage and the shift value are shifted by +0.28 V and +0.26 V, respectively. From FIG. 13B, it is found that through the stress application step, the threshold voltage and the shift value are shifted by +0.28 V and +0.17 V, respectively.

Figure 14A:
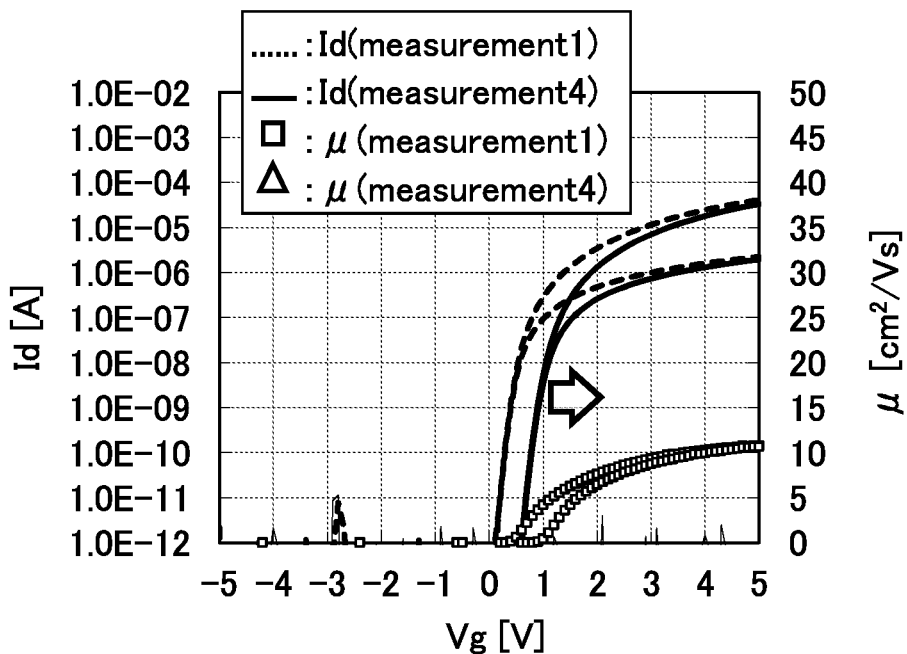
FIGS. 14A and 14B are graphs showing the relation between a gate voltage Vg and a drain current Id of a transistor, which are obtained by measurement.
Figure 14B:
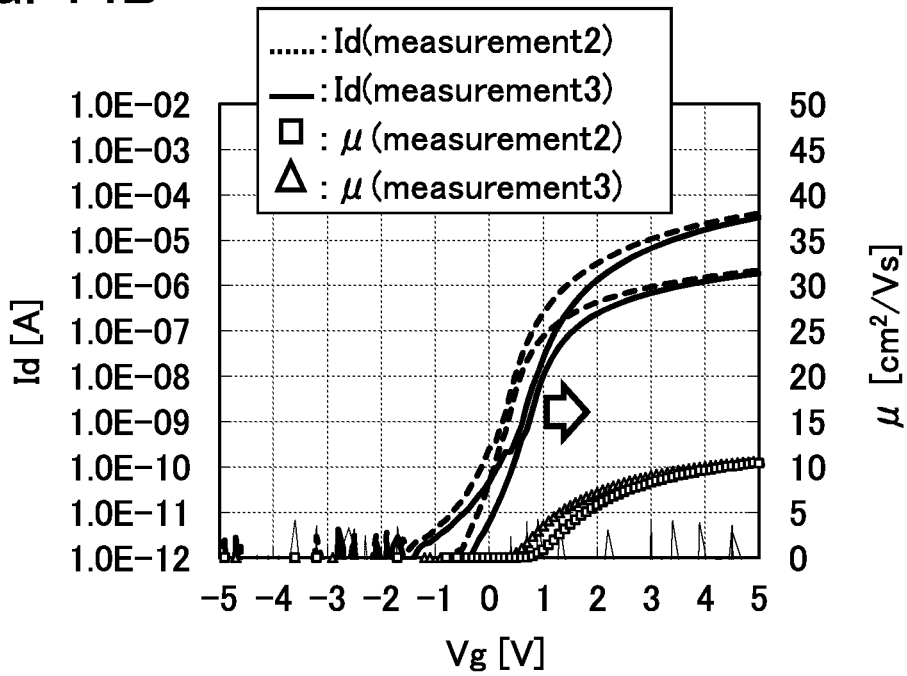

FIG. 14A shows the relation between the gate voltage Vg and the drain current Id in the third transistor, which were obtained by Measurement 1 and Measurement 4. FIG. 14A also shows the mobility μ obtained by calculation. FIG. 14B shows the relation between the gate voltage Vg and the drain current Id in the third transistor, which were obtained by Measurement 2 and Measurement 3. From FIG. 14A, it is found that through the stress application step, the threshold voltage and the shift value are shifted by +0.42 V and +0.44 V, respectively. From FIG. 14B, it is found that through the stress application step, the threshold voltage and the shift value are shifted by +0.44 V and +0.30 V, respectively.

FIGS. 12A and 12B, FIGS. 13A and 13B, and FIGS. 14A and 14B reveal the followings: change in shift value in the measurements of drain current in a state where ultraviolet light is emitted (Measurements 2 and 3) is smaller than that in measurements of drain current in a dark state (Measurements 1 and 4); the threshold voltage and the shift value in the first transistor are shifted in the negative direction by the stress application step; in contrast, the threshold voltage and the shift value in the third transistor are shifted in the positive direction by the stress application step; and change in threshold voltage and change in shift value in the second transistor are smaller than those in the first transistor and those in the third transistor. Therefore, by the driving method in which the first state (the potential of the gate is lower than the potential of the source or the potential of the drain) and the second state (the potential of the gate is higher than the potential of the source or the potential of the drain) are alternately repeated, change in electrical characteristics (e.g., change in threshold voltage and change in shift value) can be small, in comparison to the driving method in which the first state is kept and the driving method in which the second state is kept. In particular, in the driving method in which the first state and the second state are alternately repeated, it is more effective in preventing the change in electrical characteristics to set the percentage of the first state to be higher than 0% and lower than or equal to 10% in total periods.

⟨Example of Cross-sectional Structure of Sensor Circuit⟩

Figure 15:
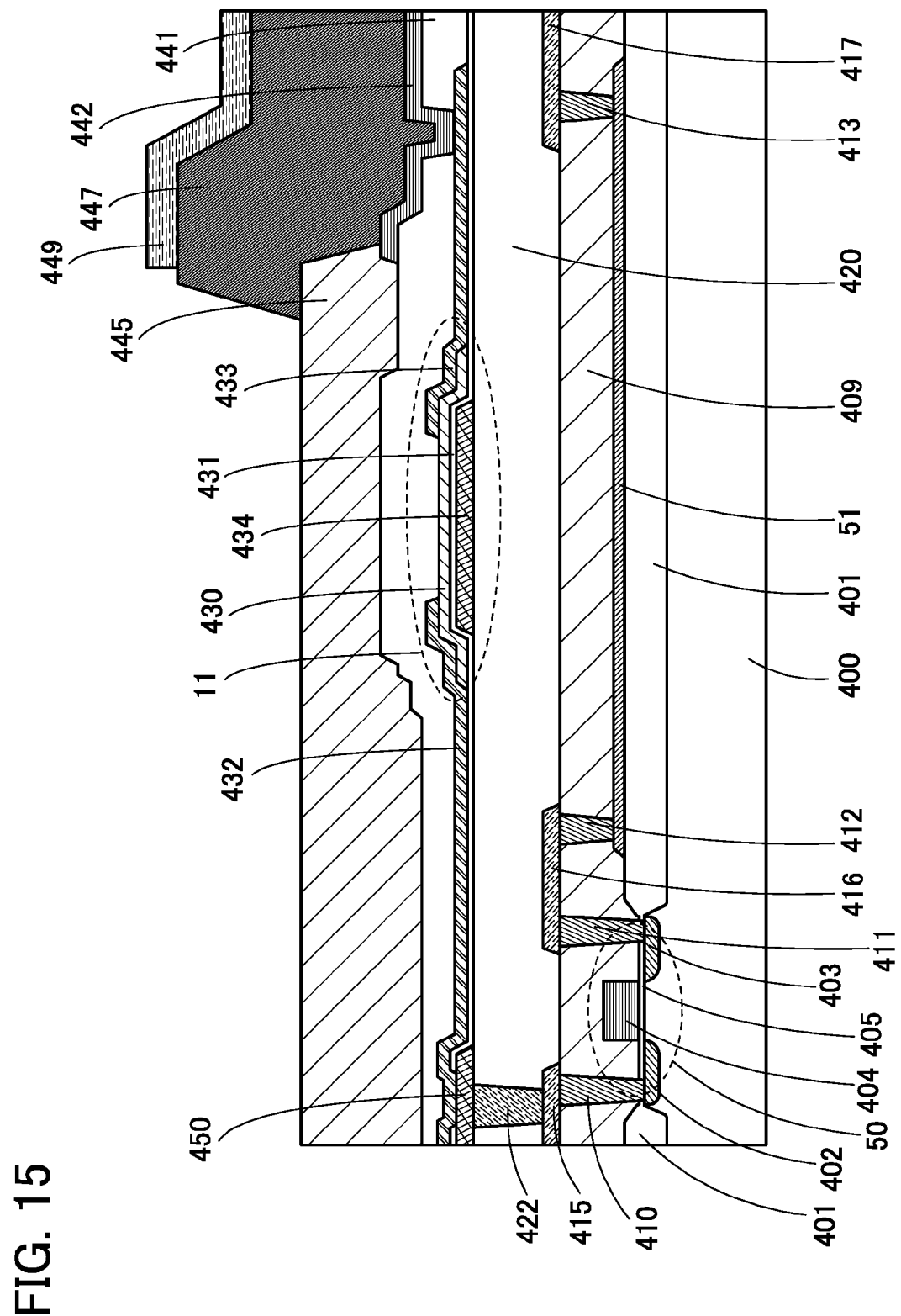
FIG. 15 illustrates a cross-sectional structure of a sensor circuit.

FIG. 15 illustrates a cross-sectional structure of the sensor circuit of one embodiment of the present invention as an example. The case is shown in FIG. 15 where the transistor 11 including a channel formation region in an oxide semiconductor film is formed over a transistor 50 including a channel formation region in a single crystal silicon substrate.

The transistor 50 corresponds to an example of the switch 13, the switch 16, or a transistor included in the circuit 15 in the sensor circuit 10 illustrated in FIG. 3. Note that an active layer in the transistor 50 can be an amorphous, microcrystalline, polycrystalline, or signal crystal semiconductor film of silicon, germanium, or the like. Alternatively, the channel formation region in the transistor 50 may be formed using an oxide semiconductor film.

In the case where the transistor 50 is formed using a silicon thin film, any of the following can be used, for example: amorphous silicon formed by sputtering or vapor deposition such as plasma CVD, polycrystalline silicon obtained by crystallization of amorphous silicon by laser annealing or the like, and single crystal silicon obtained in such a manner that a surface portion of a single crystal silicon wafer is separated after implantation of hydrogen ions or the like into the silicon wafer.

Examples of a semiconductor substrate 400 over which the transistor 50 is formed are an n-type or p-type silicon substrate, germanium substrate, silicon germanium substrate, and compound semiconductor substrate (e.g., GaAs substrate, InP substrate, GaN substrate, SiC substrate, GaP substrate, GaInAsP substrate, and ZnSe substrate). In FIG. 15, a case where a single crystal silicon substrate having n-type conductivity is used is illustrated as an example.

The transistor 50 is electrically isolated from other transistors by an element isolation insulating film 401. The element isolation insulating film 401 can be formed by a local oxidation of silicon (LOCOS) method, a trench isolation method, or the like.

In the case where a p-channel transistor is formed over the semiconductor substrate 400, an impurity element imparting p-type conductivity is selectively introduced to a region where the p-channel transistor is formed, so that a region called an n-well is formed.

Specifically, the transistor 50 includes impurity regions 402 and 403 that are formed in the semiconductor substrate 400 and function as a source region and a drain region, a gate electrode 404, and a gate insulating film 405 provided between the semiconductor substrate 400 and the gate electrode 404. The gate electrode 404 overlaps with a channel formation region formed between the impurity regions 402 and 403, with the gate insulating film 405 placed between the gate electrode 404 and the channel formation region.

A resistor 51 is provided over the element isolation insulating film 401. A semiconductor film including polycrystalline, microcrystalline, or amorphous silicon can be used for the resistor 51, for example.

An insulating film 409 is provided over the transistor 50. Openings are formed in the insulating film 409. Wirings 410 and 411 that are in contact with the impurity regions 402 and 403, respectively, and wirings 412 and 413 that are in contact with the resistor 51 are formed in the openings.

The wiring 410 is connected to a wiring 415 formed over the insulating film 409. The wirings 411 and 412 are connected to a wiring 416 formed over the insulating film 409. The wiring 413 is connected to a wiring 417 formed over the insulating film 409.

An insulating film 420 is formed over the wirings 415 to 417. An opening is formed in the insulating film 420. A wiring 422 electrically connected to the wiring 415 is formed in the opening.

In FIG. 15, the transistor 11 and a conductive film 450 electrically connected to the wiring 422 are formed over the insulating film 420.

The transistor 11 includes, a gate electrode 434 over the insulating film 420; a gate insulating film 431 over the gate electrode 434; a semiconductor film 430 which includes an oxide semiconductor and which overlaps with the gate electrode 434 with the gate insulating film 431 provided therebetween; and a conductive film 432 and a conductive film 433 over the semiconductor film 430 which serve as a source electrode and a drain electrode. The conductive film 432 is electrically connected to the conductive film 450 via an opening formed in the gate insulating film 431.

An insulating film 441 is provided over the transistor 11. An opening is provided in the insulating film 441. A conductive film 442 is provided over the insulating film 441 to be in contact with the conductive film 433 via the opening.

An insulating film 445 is provided over the insulating film 441 and the conductive film 442. An opening is provided in the insulating film 445. A conductive film 447 that is in contact with the conductive film 442 via the opening is provided over the insulating film 445. The conductive film 447 preferably has high surface flatness in order to connect a bias circuit or the like later. Thus, a resin in which conductive particles are dispersed is suitable for the material of the conductive film 447. Note that the resin has low adhesion to a solder; thus, over the conductive film 447, a conductive film 449 is formed using a conductive material having high adhesion to a solder to be in contact with the conductive film 447.

In FIG. 15, the transistor 11 includes the gate electrode 434 on at least one side of the semiconductor film 430. Alternatively, the transistor 11 may include a pair of gate electrodes with the semiconductor film 430 placed therebetween.

In the case where the transistor 11 has a pair of gate electrodes with the semiconductor film 430 therebetween, one of the gate electrodes may be supplied with a signal for controlling the on/off state of the transistor 11, and the other of the gate electrodes may be supplied with a potential from another element. In this case, potentials with the same level may be applied to the pair of gate electrodes, or a fixed potential such as the ground potential may be supplied only to the other of the gate electrodes. By controlling the level of a potential applied to the other of the gate electrodes, the threshold voltage of the transistor can be controlled.

In FIG. 15, the transistor 11 has a single-gate structure where one channel formation region corresponding to one gate electrode 434 is provided. However, the transistor 11 may have a multi-gate structure in which a plurality of gate electrodes electrically connected to each other are provided and thus a plurality of channel formation regions are included in one active layer.

⟨Semiconductor Film⟩

A highly purified oxide semiconductor (a purified oxide semiconductor) obtained by reduction of impurities such as moisture or hydrogen that serve as electron donors (donors) and reduction of oxygen vacancies is an intrinsic (i-type) semiconductor or a substantially intrinsic semiconductor. Thus, a transistor including a channel formation region in a highly purified oxide semiconductor film has extremely low off-state current and high reliability.

In the case where an oxide semiconductor film is used as the semiconductor film, at least indium (In) or zinc (Zn) is preferably included as an oxide semiconductor. The oxide semiconductor preferably contains, in addition to In and Zn, gallium (Ga) serving as a stabilizer that reduces variations in electrical characteristics among transistors using the above-described oxide semiconductor. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide, gallium nitride, or gallium oxide, the In—Ga—Zn-based oxide allows a transistor with favorable electrical characteristics to be formed over a glass substrate. Further, a larger substrate can be used.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Note that, for example, an In—Ga—Zn-based oxide means an oxide containing In, Ga, and Zn, and there is no limitation on the ratio of In, Ga, and Zn. In addition, the In—Ga—Zn—O-based oxide may contain a metal element other than In, Ga, and Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

For example, with an In—Sn—Zn-based oxide, high mobility can be realized relatively easily. However, even with an In—Ga—Zn-based oxide, mobility can be increased by reducing the defect density in the bulk.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, a term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, a term "perpendicular" indicates that the angle formed between two straight lines is greater than or equal to $80°$ and less than or equal to $100°$, and accordingly includes the case where the angle is greater than or equal to $85°$ and less than or equal to $95°$.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around $31°$. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around $56°$. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around $56°$. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around $56°$.

According to the above results, in the CAAC-OS film having c-axis alignment, while the directions of a-axes and b-axes are different between crystal parts, the c-axes are aligned in a direction parallel to a normal vector of a formation surface or a normal vector of a top surface of the CAAC-OS film. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electrical characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For example, the CAAC-OS film is formed by a sputtering method using a polycrystalline metal oxide target. When ions collide with the target, a crystal region included in the target may be separated from the target along an a-b plane; in other words, a sputtered particle having a plane parallel to an a-b plane (flat-plate-like sputtered particle or pellet-like sputtered particle) may flake off from the target. In that case, the flat-plate-like or pellet-like sputtered particle reaches a substrate in the state of maintaining its crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is from 100° C. to 740° C., preferably from 200° C. to 500° C. By increasing the substrate heating temperature during the deposition, when the flat-plate-like or pellet-like sputtered particle reaches the substrate, migration occurs on the substrate surface, so that a flat plane of the sputtered particles is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the target, an In—Ga—Zn-based oxide target is described below.

The In—Ga—Zn-based oxide target, which is polycrystalline, is made as follows: InO$_X$ powder, GaO$_Y$ powder, and ZnO$_Z$ powder are mixed in a predetermined molar ratio, pressure is applied to the mixture, and heat treatment is performed at a temperature from 1000° C. to 1500° C. Note that X, Y, and Z are each a given positive number. Here, the predetermined molar ratio of InO$_X$ powder to GaO$_Y$ powder and ZnO$_Z$ powder is, for example, 2:2:1, 8:4:3, 3:1:1, 1:1:1, 4:2:3, or 3:1:2. The kinds of powder and the molar ratio for mixing powder may be determined as appropriate depending on a desired target.

An alkali metal is not an element included in an oxide semiconductor and thus is an impurity. Also, alkaline earth metal is also an impurity in the case where an alkaline earth metal is not included in the oxide semiconductor. In particular, Na among alkali metals becomes Na$^+$ when an insulating film in contact with the oxide semiconductor film is an oxide and Na diffuses into the insulating film. In addition, in the oxide semiconductor film, Na cuts or enters a bond between a metal and oxygen which are contained in an oxide semiconductor. As a result, for example, degradation of electrical characteristics of a transistor, such as a normally-on state of the transistor due to a shift of the threshold voltage in the negative direction or a reduction in mobility, occurs. In addition, variations in electrical characteristics also occur. Specifically, the Na concentration measured by secondary ion mass spectrometry is preferably lower than or equal to $5\times10^{16}$/cm$^3$, further preferably lower than or equal to $1\times10^{16}$/cm$^3$, still further preferably lower than or equal to $1\times10^{15}$/cm$^3$. In a similar manner, the measurement value of a Li concentration is preferably less than or equal to $5\times10^{15}$/cm$^3$, further preferably less than or equal to $1\times10^{15}$/cm$^3$. Similarly, the measurement value of a K concentration is preferably less than or equal to $5\times10^{15}$/cm$^3$, further preferably less than or equal to $1\times10^{15}$/cm$^3$.

In the case where a metal oxide containing indium is used, silicon or carbon having higher bond energy with oxygen than indium might cut the bond between indium and oxygen, so that an oxygen vacancy is formed. Accordingly, when silicon or carbon is contained in the oxide semiconductor film, the electric characteristics of the transistor are likely to deteriorate as in the case of using an alkali metal or an alkaline earth metal. Thus, the concentration of silicon and the concentration of carbon in the oxide semiconductor film are preferably low. Specifically, the C concentration or the Si concentration measured by secondary ion mass spectrometry is preferably less than or equal to $1\times10^{18}$/cm$^3$. In that case, the deterioration of the electric characteristics of the transistor can be prevented, so that the reliability of the sensor circuit or the semiconductor device can be improved.

A metal in the source electrode and the drain electrode might extract oxygen from the oxide semiconductor film depending on a conductive material used for the source electrode and the drain electrode. In such a case, a region of the oxide semiconductor film in contact with the source electrode or the drain electrode becomes an n-type region due to the formation of an oxygen vacancy.

The n-type region serves as a source region or a drain region, resulting in a decrease in the contact resistance between the oxide semiconductor film and the source electrode or the drain electrode. Accordingly, the formation of the n-type region increases the mobility and on-state current of the transistor, which achieves high-speed operation of a switch circuit using the transistor.

Note that the extraction of oxygen by a metal in the source electrode and the drain electrode is probably caused when the source electrode and the drain electrode are formed by a sputtering method or when heat treatment is performed after the formation of the source electrode and the drain electrode.

The n-type region is more likely to be formed by forming the source electrode and the drain electrode with use of a conductive material which is easily bonded to oxygen. Examples of such a conductive material include Al, Cr, Cu, Ta, Ti, Mo, and W.

The oxide semiconductor film is not limited to a single-layer metal oxide film and may have a layered structure of a plurality of metal oxide films. In a semiconductor film in which first to third metal oxide films are sequentially stacked, for example, the first metal oxide film and the third metal oxide film are each an oxide film which contains at least one of the metal elements contained in the second metal oxide film and whose lowest conduction band energy is closer to the vacuum level than that of the second metal oxide film by higher than or equal to 0.05 eV, 0.07 eV, 0.1 eV, or 0.15 eV and lower than or equal to 2 eV, 1 eV, 0.5 eV, or 0.4 eV. Further, the second metal oxide film preferably contains at least indium in order to increase the carrier mobility.

In the transistor including the above oxide semiconductor film, when a voltage is applied to the gate electrode so that an electric field is applied to the semiconductor film, a channel region is formed in the second metal oxide film whose lowest conduction band energy is small in the semiconductor film. That is, since the third metal oxide film is provided between the second metal oxide film and the gate insulating film, a channel region can be formed in the second metal oxide film which is insulated from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, which results in an increase in the field-effect mobility of the transistor.

Further, when an interface level is formed at the interface between the second metal oxide film and the first metal oxide film, a channel region is formed also in the vicinity of the interface, which causes change in the threshold voltage of the transistor. However, since the first metal oxide film contains at least one of the metal elements contained in the second metal oxide film, an interface level is unlikely to be formed at the interface between the second metal oxide film and the first metal oxide film. Accordingly, the above structure allows reducing of variations in the electrical characteristics of the transistor, such as the threshold voltage.

Further, it is preferable that a plurality of metal oxide films be stacked so that an interface level due to an impurity existing between the metal oxide films, which inhibits carrier flow, is not formed at the interface between the metal oxide films. This is because when an impurity exists between the stacked metal oxide films, the continuity of the lowest conduction band energy between the metal oxide films is lost, and carriers are trapped or disappear by recombination in the vicinity of the interface. By reducing an impurity existing between the films, a continuous junction (here, in particular, a U-shape well structure whose lowest conduction band energy is changed continuously between the films) is formed more easily than the case of merely stacking a plurality of metal oxide films which share at least one main metal component.

To form the continuous junction, each film needs to be stacked successively without exposure to the atmosphere using a multi-chamber deposition apparatus (sputtering apparatus) including a load lock chamber. Each chamber in the sputtering apparatus is preferably subjected to high vacuum evacuation (to a vacuum of about $5\times10^{-7}$ Pa to $1\times10^{-4}$ Pa) with use of a suction vacuum evacuation pump such as a cryopump so that water or the like, which is an impurity for the oxide semiconductor, is removed as much as possible. Alternatively, a turbo-molecular pump is preferably used in combination with a cold trap to prevent backflow of gas into the chamber through an evacuation system.

To obtain a highly purified intrinsic oxide semiconductor, a chamber needs to be subjected to high vacuum evacuation, and in addition, a sputtering gas needs to be highly purified. When a highly purified oxygen gas or argon gas having a dew point of $-40°$ C. or lower, preferably $-80°$ C. or lower, and more preferably $-100°$ C. or lower is used as the sputtering gas, moisture or the like can be prevented from entering the oxide semiconductor film as much as possible.

The first metal oxide film or the third metal oxide film may be an oxide film containing aluminum, silicon, titanium, gallium, germanium, yttrium, zirconium, tin, lanthanum, cerium, or hafnium at a higher atomic ratio than the second metal oxide film. Specifically, the first metal oxide film or the third metal oxide film may be an oxide film containing the above element at an atomic ratio 1.5 times or more, preferably twice or more, and more preferably three times or more that in the second metal oxide film. The above element is strongly bonded to oxygen and thus has a function of suppressing generation of oxygen vacancies in the oxide film. That is, oxygen vacancies are less likely to be generated in the first metal oxide film or the third metal oxide film than in the second metal oxide film.

Specifically, when both the second metal oxide film and the first metal oxide film or the third metal oxide film include an In-M-Zn-based oxide, the atomic ratio of the first metal oxide film or the third metal oxide film, In:M:Zn=$x_1$:$y_1$:$z_1$, and the atomic ratio of the second metal oxide film, In:M:Zn=$x_2$:$y_2$:$z_2$, may be determined so that $y_1/x_1$ is larger than $y_2/x_2$. Note that the element M is a metal element which has a higher ability than In to bind to oxygen, examples of which include Al, Ti, Ga, Y, Zr, Sn, La, Ce, Nd, and Hf. The atomic ratio is preferably determined so that $y_1/x_1$ is 1.5 or more times $y_2/x_2$. More preferably, the atomic ratio is determined so that $y_1/x_1$ is 2 or more times $y_2/x_2$. Still more preferably, the atomic ratio is determined so that $y_1/x_1$ is 3 or more times $y_2/x_2$. Further, it is preferable that $y_2$ be greater than or equal to $x_2$ in the second metal oxide film, in which case the transistor can have stable electrical characteristics. Note that $y_2$ is preferably less than 3 times $x_2$ because the field-effect mobility of the transistor is lowered if $y_2$ is 3 or more times $x_2$.

The first metal oxide film and the third metal oxide film each have a thickness of 3 nm to 100 nm, preferably 3 nm to 50 nm. The second metal oxide film has a thickness of 3 nm to 200 nm, preferably 3 nm to 100 nm, and more preferably 3 nm to 50 nm.

In the three-layer semiconductor film, the first metal oxide film and the third metal oxide film can be amorphous or crystalline. Note that the second metal oxide film in which a channel region is formed preferably has a crystalline structure, in which case the transistor can have stable electrical characteristics.

Note that a channel formation region refers to a region of a semiconductor film of a transistor, which overlaps with a gate electrode and which is between a source electrode and a drain electrode. Further, a channel region refers to a region through which current mainly flows in the channel formation region.

For example, in the case where an In—Ga—Zn-based oxide film formed by a sputtering method is used as each of the first metal oxide film and the third metal oxide film, the first metal oxide film and the third metal oxide film can be deposited with use of an In—Ga—Zn-based oxide target (In:Ga:Zn=1:3:2 [atomic ratio]). The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, in the case where the second metal oxide film is a CAAC-OS film, the second metal oxide film is preferably deposited with use of a polycrystalline In—Ga—Zn-based oxide target containing In, Ga, and Zn at an atomic ratio of 1:1:1. The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Although the oxide semiconductor film described above can be formed by a sputtering method, such film may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate.

For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Instead of an $In(CH_3)_3$ gas, an $In(C_2H_5)_3$ may be used. Furthermore, a $Zn(CH_3)_2$ gas may be used.

Note that the edge portion of the semiconductor film included in the transistor may be inclined or may be rounded.

Also in the case where a semiconductor film including stacked metal oxide films is used in the transistor, a region in contact with the source electrode or the drain electrode can be an n-type region. Such a structure increases the mobility and on-state current of the transistor and achieves high-speed operation of a sensor circuit or a semiconductor device using the transistor. Furthermore, in the case where the semiconductor film including the stacked metal oxide films is used in the transistor, the n-type semiconductor region particularly preferably reaches the second metal oxide film part of which is to be a channel region, in which case the mobility and on-state current of the transistor are increased and higher-speed operation of the sensor circuit or the semiconductor device is achieved.

Figure 16:
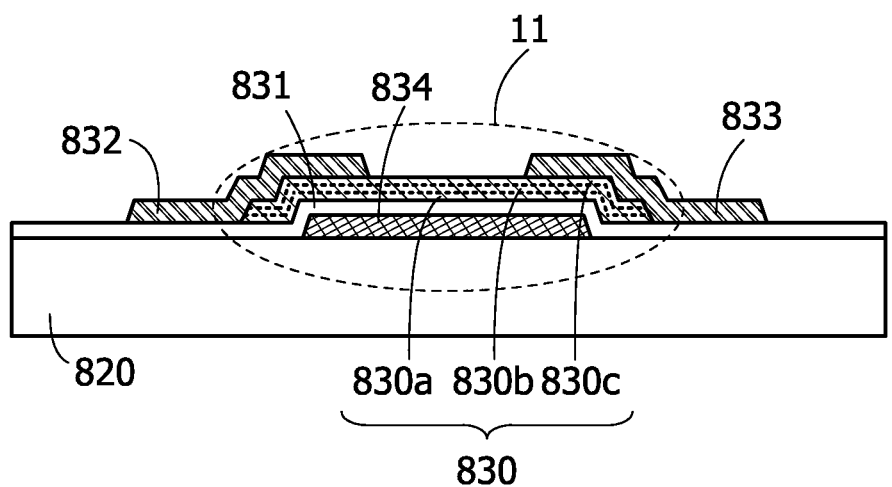
FIG. 16 illustrates a structure of a transistor.

FIG. 16 illustrates a cross-sectional structure of the transistor 11 as another example. The transistor 11 illustrated in FIG. 16 includes a gate electrode 834 over an insulating film 820 and the like; a gate insulating film 831 over the gate electrode 834; a semiconductor film 830 which overlaps with the gate electrode 834 with the gate insulating film 831 provided therebetween; and a conductive film 832 and a conductive film 833 which are electrically connected to the semiconductor film 830.

The semiconductor film 830 is not limited to a single oxide semiconductor film and may have a stacked structure including a plurality of oxide semiconductor films. The semiconductor film 830 in FIG. 16 is formed of three oxide semiconductor films. Specifically, in the transistor 11 illustrated in FIG. 16, the semiconductor film 830 is formed by stacking oxide semiconductor films 830a to 830c sequentially from the insulating film 820 side.

The oxide semiconductor films 830a and 830c each contains at least one of metal elements contained in the oxide semiconductor film 830b. The energy at the bottom of the conduction band of the oxide semiconductor films 830a and 830c is closer to a vacuum level than that of the oxide semiconductor film 830b by 0.05 eV or more, 0.07 eV or more, 0.1 eV or more, or 0.15 eV or more and 2 eV or less, 1 eV or less, 0.5 eV or less, or 0.4 eV or less. Furthermore, the oxide semiconductor film 830b preferably contains at least indium in order to increase the carrier mobility.

⟨Structural Example of Module⟩

Figure 17:
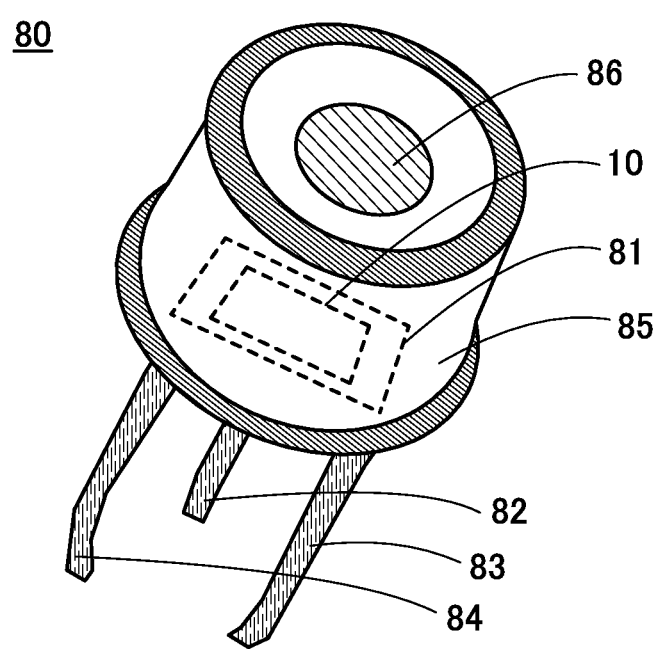
FIG. 17 illustrates a structure of a module.

A module that is enclosed in a package to be protected from environmental conditions such as heat, pressure, and oscillation is also included in the category of the semiconductor device of one embodiment of the present invention. FIG. 17 illustrates an example of a structure of a module 80 including the sensor circuit 10 of one embodiment of the present invention.

In the module 80 illustrated in FIG. 17, the sensor circuit 10 is mounted on an interposer 81 by a wire bonding method or the like. The interposer 81 is electrically connected to terminals 82, 83, and 84. The sensor circuit 10 and the interposer 81 are installed in a housing 85. The housing 85 is provided with a window 86 which transmits light, particularly transmits ultraviolet light. The housing 85 except for the window 86 is preferably formed of a material that prevents light transmission, especially prevents ultraviolet light transmission. The window 86 may be provided with optical system such as a lens that collects light into the sensor circuit 10. The terminals 82 to 84 to which the interposer 81 is connected are partly led out from the housing 85, as illustrated in FIG. 17.

⟨Examples of Electronic Devices⟩

Figure 18A:
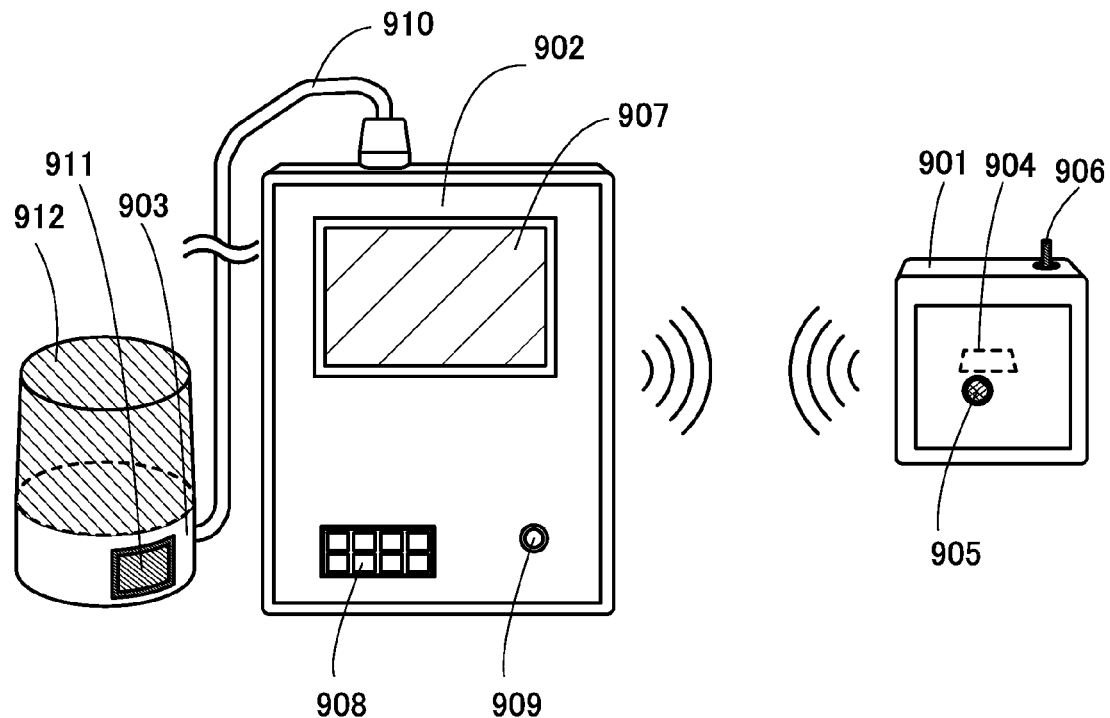
FIGS. 18A to 18C illustrate electronic devices.
Figure 18B:
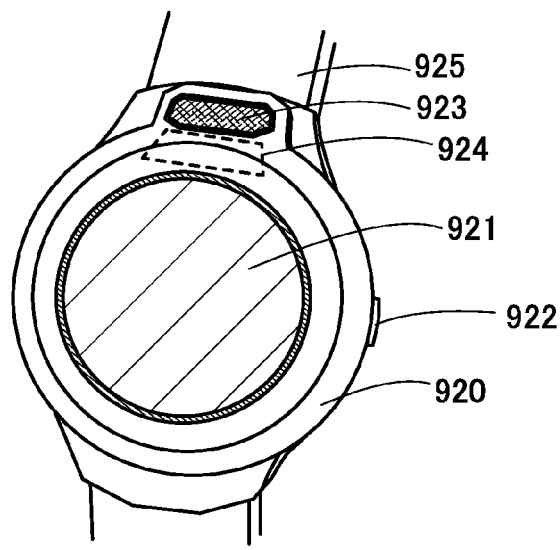
Figure 18C:
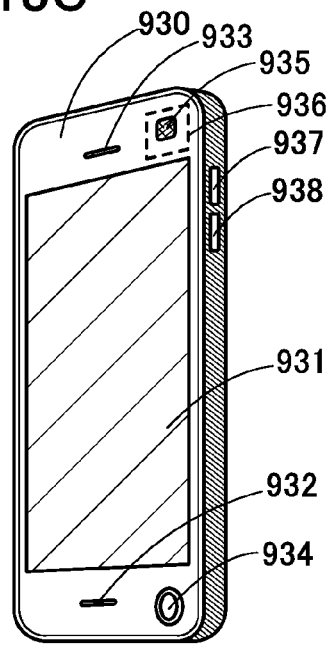

The semiconductor device of one embodiment of the present invention can be used for display devices, personal computers, and image reproducing devices provided with recording media (typically, devices that reproduce the content of recording media such as digital versatile discs (DVDs) and have displays for displaying the reproduced images). Other examples of electronic devices that can include the semiconductor device in one embodiment of the present invention are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 18A to 18C illustrate specific examples of these electronic devices.

FIG. 18A illustrates a fire alarm equipment, which includes a detector 901, a fire alarm control panel 902, and a fire alarm notification appliance 903.

The detector 901 includes a sensor circuit 904 which is one embodiment of the present invention, a window 905, an operation key 906, and the like. The sensor circuit 904 is irradiated with light passing through the window 905. The sensor circuit 904 detects ultraviolet light emitted from a heat source such as a fire. When the sensor circuit 904 detects ultraviolet light having a radiant intensity exceeding a predetermined value, the detector 901 transmits the information to the fire alarm control panel 902. The fire alarm control panel 902 includes a display portion 907, operation keys 908, an operation key 909, a wiring 910, and the like. The fire alarm control panel 902 controls operation of the fire alarm notification appliance 903 in accordance with information transmitted by the detector 901. The fire alarm notification appliance 903 includes a speaker 911, a lighting device 912, and the like. The fire alarm notification appliance 903 has a function of raising an alarm in accordance with command by the fire alarm control panel 902. In FIG. 18A, the fire alarm notification appliance 903 raises an alarm using warning sound by the speaker 911 and warning light (e.g., red light) by the lighting device 912; alternatively, the fire alarm notification appliance 903 may give an alarm using any one of sound and light or another means.

The fire alarm control panel 902 may command fire preventive equipment such as a shutter to perform a predetermined operation when an alarm is given. Although FIG. 18A illustrates an example where signals are wirelessly transmitted and received between the fire alarm control panel 902 and the detector 901, signals may be transmitted and received via a wiring or the like. In addition, although FIG. 18A illustrates an example where a signal is transmitted from fire alarm control panel 902 to the fire alarm notification appliance 903 via the wiring 910, a signal may be wirelessly transmitted.

FIG. 18B illustrates a wristwatch, which includes a housing 920, a display portion 921, an operation button 922, a window 923, a sensor circuit 924, a bracelet 925, and the like. The sensor circuit 924 is irradiated with light passing through the window 923.

FIG. 18C illustrates a mobile phone, which includes a housing 930, a display portion 931, a microphone 932, a speaker 933, a camera 934, a window 935, a sensor circuit 936, an operation button 937, and an operation 938. The sensor circuit 936 is irradiated with light passing through the window 935.

This application is based on Japanese Patent Application serial no. 2013-040501 filed with Japan Patent Office on Mar. 1, 2013, the entire contents of which are hereby incorporated by reference.

What is claimed is:

1. A sensor circuit comprising:
   a transistor including a channel formation region in an oxide semiconductor;
   a first circuit configured to supply one of a first potential and a second potential to a gate of the transistor;
   a switch; and
   a second circuit configured to be applied with a current flowing between a source and a drain of the transistor via the switch when the first potential is applied to the gate of the transistor,
   wherein the second circuit is configured to generate a signal including data of a value of the current,
   wherein the first potential is lower than a potential of the source or a potential of the drain of the transistor, and
   wherein the second potential is higher than the potential of the source or the potential of the drain of the transistor.

2. The sensor circuit according to claim 1, wherein the oxide semiconductor comprises In, Ga, and Zn.

3. The sensor circuit according to claim 1, further comprising:
   a second transistor over a substrate; and
   an insulating film over the second transistor,
   wherein the transistor is over the insulating film.

4. A sensor circuit comprising:
   a transistor including a channel formation region in an oxide semiconductor;
   a first circuit configured to supply one of a first potential and a second potential to a gate of the transistor;
   a first switch;
   a second switch; and
   a second circuit configured to be applied with a current flowing between a source and a drain of the transistor via the second switch when the first potential is applied to the gate of the transistor,
   wherein the first potential is lower than a potential of the source or a potential of the drain of the transistor,
   wherein the second potential is higher than the potential of the source or the potential of the drain of the transistor,
   wherein the first switch electrically connects the source and the drain of the transistor when the second potential is applied to the gate of the transistor,
   wherein the first switch electrically isolates the source and the drain of the transistor when the first potential is applied to the gate of the transistor, and
   wherein the second circuit is configured to generate a voltage corresponding to a value of the current.

5. The sensor circuit according to claim 4, wherein the oxide semiconductor comprises In, Ga, and Zn.

6. The sensor circuit according to claim 4, further comprising:
   a second transistor over a substrate; and
   an insulating film over the second transistor,
   wherein the transistor is over the insulating film.

7. A semiconductor device comprising:
   a sensor circuit comprising:
      a transistor including a channel formation region in an oxide semiconductor;
      a first circuit configured to supply one of a first potential and a second potential to a gate of the transistor; and
      a second circuit configured to be applied with a current flowing between a source and a drain of the transistor when the first potential is applied to the gate of the transistor,
   an output device; and
   a signal processing circuit controlling operation of the output device by using a signal output from the sensor circuit,
   wherein the second circuit is configured to generate a signal including data of a value of the current,
   wherein the first potential is lower than a potential of the source or a potential of the drain of the transistor, and
   wherein the second potential is higher than the potential of the source or the potential of the drain of the transistor.

8. The semiconductor device according to claim 7, wherein the oxide semiconductor comprises In, Ga, and Zn.

9. The sensor circuit according to claim 7, further comprising:
   a second transistor over a substrate; and
   an insulating film over the second transistor,
   wherein the transistor is over the insulating film.

10. A semiconductor device comprising:
    a sensor circuit comprising:
       a transistor including a channel formation region in an oxide semiconductor;
       a first circuit configured to supply one of a first potential and a second potential to a gate of the transistor;
       a first switch;
       a second switch; and
       a second circuit configured to be applied with a current flowing between a source and a drain of the transistor via the second switch when the first potential is applied to the gate of the transistor,
    an output device; and
    a signal processing circuit controlling operation of the output device by using a signal output from the sensor circuit,
    wherein the first potential is lower than a potential of the source or a potential of the drain of the transistor,
    wherein the second potential is higher than the potential of the source or the potential of the drain of the transistor,
    wherein the first switch electrically connects the source and the drain of the transistor when the second potential is applied to the gate of the transistor,
    wherein the first switch electrically isolates the source and the drain of the transistor when the first potential is applied to the gate of the transistor, and
    wherein the second circuit is configured to generate a voltage corresponding to a value of the current and generate the signal using the voltage.

11. The semiconductor device according to claim 10, wherein the oxide semiconductor comprises In, Ga, and Zn.

12. The sensor circuit according to claim 10, further comprising:
    a second transistor over a substrate; and
    an insulating film over the second transistor,
    wherein the transistor is over the insulating film.

* * * * *